United States Patent
Furuta et al.

(10) Patent No.: US 9,680,085 B2
(45) Date of Patent: Jun. 13, 2017

(54) CERAMIC POWDER, PIEZOELECTRIC CERAMIC, PIEZOELECTRIC ELEMENT, AND ELECTRONIC EQUIPMENT

(71) Applicant: CANON KABUSHIKI KAISHA, Tokyo (JP)

(72) Inventors: Tatsuo Furuta, Machida (JP); Yasushi Shimizu, Fujisawa (JP); Hidenori Tanaka, Yokohama (JP); Akira Uebayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 14/638,998

(22) Filed: Mar. 4, 2015

(65) Prior Publication Data

US 2015/0255703 A1  Sep. 10, 2015

(30) Foreign Application Priority Data

Mar. 7, 2014 (JP) ................. 2014-045625

(51) Int. Cl.

| | |
|---|---|
| H01L 41/083 | (2006.01) |
| B06B 1/06 | (2006.01) |
| B41J 2/14 | (2006.01) |
| H01L 41/187 | (2006.01) |
| H02N 2/00 | (2006.01) |
| H01L 41/09 | (2006.01) |
| H02N 2/16 | (2006.01) |
| H04N 5/225 | (2006.01) |

(52) U.S. Cl.
CPC .............. *H01L 41/083* (2013.01); *B06B 1/06* (2013.01); *B41J 2/14201* (2013.01); *B41J 2/14233* (2013.01); *H01L 41/0926* (2013.01); *H01L 41/0973* (2013.01); *H01L 41/1871* (2013.01); *H02N 2/001* (2013.01); *H02N 2/163* (2013.01); *B41J 2202/03* (2013.01); *H04N 5/2251* (2013.01); *Y10T 428/2982* (2015.01)

(58) Field of Classification Search
CPC .............. H01L 41/083; H01L 41/1871; H01L 41/0926; H01L 41/0973; B06B 1/06; B41J 2/14201; B41J 2/14233; B41J 2202/03; H02N 2/001; H02N 2/163; Y10T 428/2982
USPC ...... 428/402; 252/62.9 PZ; 310/323.02, 324, 310/334, 366; 347/68; 348/374
See application file for complete search history.

(56) References Cited

U.S. PATENT DOCUMENTS

| | | | | |
|---|---|---|---|---|
| 4,988,468 A | * | 1/1991 | Nishioka .............. | H01G 4/1245 264/658 |
| 5,264,402 A | * | 11/1993 | Sano ................... | C04B 35/4682 501/137 |
| 5,604,166 A | * | 2/1997 | Sasaki .................. | C04B 35/468 501/137 |
| 8,702,885 B2 | * | 4/2014 | Matsuda ................ | B28B 1/008 156/89.11 |
| 8,846,556 B2 | * | 9/2014 | Kubota .............. | C04B 35/4682 252/62.9 PZ |
| 9,130,168 B2 | * | 9/2015 | Kubota .............. | C04B 35/4682 |
| 9,166,140 B2 | * | 10/2015 | Tanaka ................ | H01L 41/0973 |
| 9,306,150 B2 | * | 4/2016 | Tanaka ................ | H01L 41/0973 |
| 9,412,931 B2 | * | 8/2016 | Shimada ................ | G02B 7/021 |
| 2014/0117811 A1 | * | 5/2014 | Hayashi ............... | B41J 2/14233 310/313 R |
| 2014/0145106 A1 | * | 5/2014 | Hayashi .............. | C04B 35/4682 252/62.9 PZ |
| 2016/0204335 A1 | * | 7/2016 | Oshima ............... | H01L 41/1871 347/68 |
| 2016/0204336 A1 | * | 7/2016 | Shimizu ............... | B41J 2/14233 347/68 |

FOREIGN PATENT DOCUMENTS

| | | |
|---|---|---|
| CN | 101157544 A | 4/2008 |
| CN | 101962285 A | 2/2011 |
| CN | 103283051 A | 9/2013 |
| JP | 2013-216565 A | 10/2013 |

OTHER PUBLICATIONS

Jiang et al., "Effects of Mn-doping on the properties of (Ba0.92Ca0.08)(Ti0.95Zr0.05)O3 lead-free ceramics", Journal of Alloys and Compounds, (2013), vol. 574, pp. 88-91.

* cited by examiner

Primary Examiner — Leszek Kiliman
(74) Attorney, Agent, or Firm — Canon U.S.A. Inc., IP Division

(57) ABSTRACT

A ceramic powder contains a metal oxide represented by the following general formula (1). The ceramic powder has a single perovskite-type crystal phase. The ceramic powder is composed of particles having an average equivalent circular diameter in the range of 100 nm or more and less than 1000 nm and has a ratio $c_1/a_1$ in the range of $1.000 \leq c_1/a_1 \leq 1.010$, wherein $c_1$ and $a_1$ denote the c-axis length and a-axis length, respectively, of unit cells of the perovskite-type metal oxide, $c_1$ being greater than or equal to $a_1$.

formula (1) $(Ba_{1-x}Ca_x)_\alpha(Ti_{1-y-z}Zr_yMn_z)O_3$
$(0.9900 \leq \alpha \leq 1.0100, 0.125 \leq x \leq 0.300,$
$0.020 \leq y \leq 0.095, 0.003 \leq z \leq 0.016)$.

42 Claims, 15 Drawing Sheets

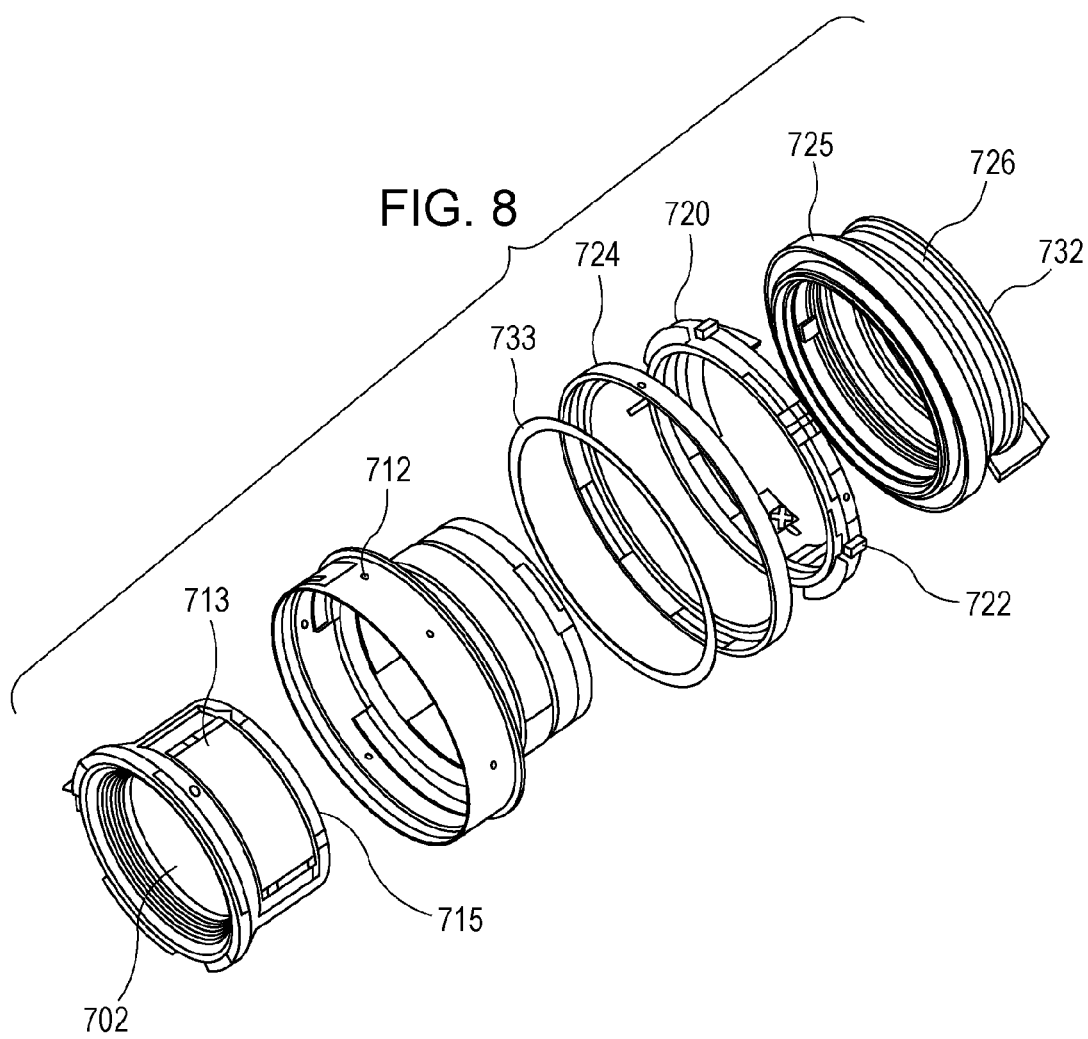

CERAMIC POWDER, PIEZOELECTRIC CERAMIC, PIEZOELECTRIC ELEMENT, AND ELECTRONIC EQUIPMENT

BACKGROUND OF THE INVENTION

Field of the Invention

The present invention relates to a piezoelectric ceramic and a ceramic powder raw material for the piezoelectric ceramic and more particularly to a lead-free piezoelectric ceramic and a lead-free ceramic powder. The present invention also relates to a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric ceramic.

Description of the Related Art

In general, piezoelectric ceramics are $ABO_3$ perovskite-type metal oxides, such as lead zirconate titanate (hereinafter referred to as "PZT"). However, PZT contains lead at an A site of its perovskite structure. Thus, the adverse effects of the lead component on the environment are regarded as problems. To address these problems, piezoelectric ceramics and piezoelectric elements that contain lead-free perovskite-type metal oxides have been proposed.

Known piezoelectric ceramics composed of lead-free perovskite-type metal oxides include barium titanate ($BaTiO_3$) and its derivative materials. Journal of Alloys and Compounds, 2013, vol. 574, pp. 88-91 discloses a piezoelectric ceramic in which the A sites of barium titanate are partly replaced with calcium (Ca) and the B sites of the barium titanate are partly replaced with zirconium (Zr) in order to improve the room-temperature piezoelectric constant of the barium titanate. Furthermore, manganese (Mn) is added to improve the mechanical quality factor of the barium titanate.

Improvement in mechanical quality factor is effective in reducing the heat generation and power consumption of a piezoelectric element in operation. However, the piezoelectric ceramic disclosed in the journal has a still low mechanical quality factor. Although Mn may be further added to the barium titanate to further increase the mechanical quality factor, the amount of Mn is negatively correlated with the piezoelectric constant, as shown in Table 1 of the journal, and the addition of Mn results in a decrease in piezoelectric constant. Thus, satisfying both a high piezoelectric constant and a high mechanical quality factor is a challenging task.

The present invention provides a lead-free piezoelectric ceramic that has both a high piezoelectric constant and a high mechanical quality factor and a ceramic powder raw material for the lead-free piezoelectric ceramic. The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and an electronic equipment, each including the piezoelectric ceramic.

SUMMARY OF THE INVENTION

A ceramic powder according to one aspect of the present invention contains a metal oxide represented by the following general formula (1):

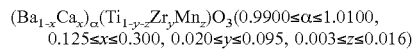
$(Ba_{1-x}Ca_x)_\alpha(Ti_{1-y-z}Zr_yMn_z)O_3$ ($0.9900 \leq \alpha \leq 1.0100$, $0.125 \leq x \leq 0.300$, $0.020 \leq y \leq 0.095$, $0.003 \leq z \leq 0.016$)

wherein the ceramic powder has a single perovskite-type crystal phase, and the ceramic powder is composed of particles having an average equivalent circular diameter in the range of 100 nm or more and less than 1000 nm and has a ratio $c_1/a_1$ in the range of $1.000 \leq c_1/a_1 \leq 1.010$, wherein $c_1$ and $a_1$ denote the c-axis length and a-axis length, respectively, of unit cells of the perovskite-type metal oxide, $c_1$ being greater than or equal to $a_1$.

A piezoelectric ceramic according to one aspect of the present invention is formed by firing the ceramic powder.

A piezoelectric ceramic according to one aspect of the present invention is composed mainly of a perovskite-type metal oxide represented by the general formula (2), wherein the metal oxide contains manganese, and the Mn content ranges from 0.02 to 0.40 parts by weight on a metal basis per 100 parts by weight of the metal oxide.

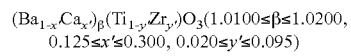
$(Ba_{1-x'}Ca_{x'})_\beta(Ti_{1-y'}Zr_{y'})O_3$ ($1.0100 \leq \beta \leq 1.0200$, $0.125 \leq x' \leq 0.300$, $0.020 \leq y' \leq 0.095$)

A piezoelectric element according to one aspect of the present invention includes a first electrode, a piezoelectric ceramic, and a second electrode, wherein the piezoelectric ceramic is a piezoelectric ceramic according to one aspect of the present invention.

Electronic equipment according to one aspect of the present invention includes a piezoelectric acoustic component that includes a piezoelectric element or a multilayered piezoelectric element according to one aspect of the present invention.

The present invention can provide a ceramic powder that can form a lead-free piezoelectric ceramic having a high piezoelectric constant and an improved mechanical quality factor.

Further features of the present invention will become apparent from the following description of examples with reference to the attached drawings.

BRIEF DESCRIPTION OF THE DRAWINGS

FIG. 8 is a schematic view of an optical apparatus according to an embodiment of the present invention.

DESCRIPTION OF THE EMBODIMENTS

Figure 1A:
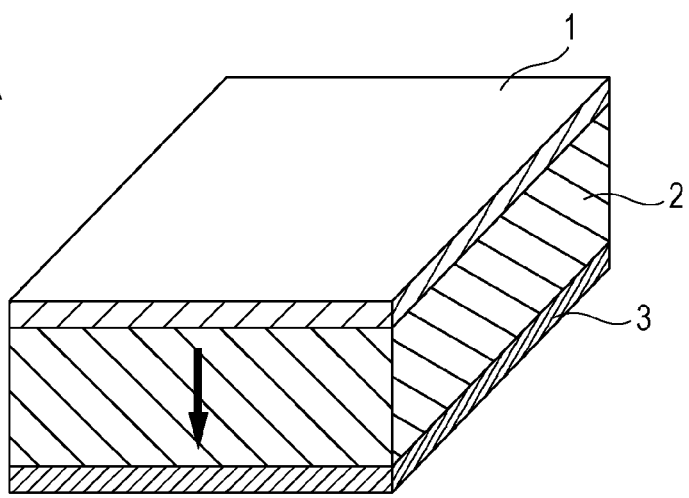
FIGS. 1A to 1C are schematic views of a piezoelectric element according to an embodiment of the present invention.

Embodiments of the present invention will be described below.

A ceramic powder according to an embodiment of the present invention is composed of a metal oxide represented by the following general formula (1):

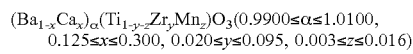
(0.125≤x≤0.300, 0.020≤y≤0.095, 0.003≤z≤0.016)

wherein the ceramic powder has an X-ray diffraction pattern assigned to a single perovskite-type crystal phase, and the ceramic powder is composed of particles having an average equivalent circular diameter in the range of 100 nm or more and less than 1000 nm and has a ratio $c_1/a_1$ in the range of $1.000 \le c_1/a_1 \le 1.010$, wherein $c_1$ and $a_1$ denote the c-axis length and a-axis length, respectively, of unit cells of the perovskite-type metal oxide, $c_1$ being greater than or equal to $a_1$.

Ceramic Powder

The term "ceramic", as used herein, refers to a sintered aggregate (also referred to as a bulk) of crystal grains, that is, a polycrystalline solid, composed mainly of a metal oxide. The term "ceramic powder", as used herein, refers to a powdered aggregate of crystal grains.

Thus, crystal grains are sintered to form an aggregate, which is hereinafter referred to as a ceramic, and a ceramic is pulverized to form a powder, which is hereinafter referred to as a ceramic powder. The ceramic powder can be used to produce a ceramic again.

A ceramic powder according to an embodiment of the present invention is composed mainly of a crystalline perovskite-type metal oxide.

Perovskite-Type Metal Oxide

The term "perovskite-type metal oxide", as used herein, refers to a metal oxide having a perovskite structure, which is ideally a cubic structure, as described in Iwanami Rikagaku Jiten, 5th edition (Iwanami Shoten, published on Feb. 20, 1998). A metal oxide having a perovskite structure is generally represented by the chemical formula $ABO_3$. In a perovskite-type metal oxide, elements A and B in the form of ions occupy particular positions of a unit cell referred to as an A site and a B site, respectively. In a cubic unit cell, the element A occupies the vertexes of the cube, and the element B occupies the body-centered position of the cube. The element O in the form of an oxygen anion occupies the face-centered positions of the cube.

In the metal oxide represented by the general formula (1), the metallic elements at the A site are divalent Ba and Ca, and the metallic elements at the B site are Ti, Zr, and Mn.

In the general formula (1), although the mole ratio of the B site element to the element O is 1:3, small variations in the mole ratio (for example, 1.00:2.94 to 1.00:3.06) are within the scope of the present invention.

Even a ceramic powder composed of a mixture having macroscopically the same element ratio as the metal oxide represented by the general formula (1) may have a primary crystal phase (primary phase) different from a perovskite-type crystal phase when particular raw materials or a particular synthesis method is used. Furthermore, a ceramic powder may contain a perovskite-type metal oxide different from a solid solution of the metal oxide represented by the general formula (1). This means that the ceramic powder has a nonuniform composition distribution. In a piezoelectric ceramic formed by molding and sintering such a ceramic powder having a nonuniform composition distribution, the nonuniform distribution is not fully reduced or diffused even after the sintering process. Thus, the displacement of the piezoelectric ceramic due to the piezoelectric effect varies in different portions thereof.

Mechanical frictional heat (elastic loss) is generated in a piezoelectric ceramic. A piezoelectric ceramic having a nonuniform composition distribution has a large elastic loss and a low mechanical quality factor.

The term "primary phase", as used herein, refers to a crystal phase of crystal grains having the highest concentration (occupancy) among the crystal phases of crystal grains in a ceramic powder. A ceramic powder according to an embodiment of the present invention has a perovskite-type crystal phase as the primary phase.

Single Perovskite-Type Crystal Phase

A ceramic powder according to an embodiment of the present invention has a single perovskite-type crystal phase. More specifically, a ceramic powder according to an embodiment of the present invention has an X-ray diffraction pattern assigned to a single perovskite-type crystal phase.

Whether the crystal structure of a ceramic powder is a single perovskite-type crystal phase can be determined by structural analysis of a peak pattern (X-ray diffraction pattern) obtained in an X-ray diffraction measurement. The term "single", as used herein, refers to the state in which no diffraction peak assigned to another perovskite-type crystal phase, a non-perovskite-type crystal phase, or an amorphous phase other than the primary perovskite-type crystal phase (primary phase) is substantially observed in an X-ray diffraction pattern of a ceramic powder according to an embodiment of the present invention.

The diffraction X-ray intensity in X-ray diffractometry is obtained as the total diffraction intensity of single crystals aligned in various directions. In the X-ray measurement of a ceramic powder, a surface of a sample to be measured should be as uniform as possible. In the case where it is difficult to form a uniform surface, measurements are repeated at different portions until the averaged diffraction X-ray intensity at each incident angle becomes constant.

Whether the crystal structure of a ceramic powder is a single perovskite-type crystal phase can also be determined by structural analysis of electron diffraction data. When electron diffraction is used, measurements in many portions are averaged, because electron diffraction measurement is more localized than X-ray diffractometry.

The ceramic powder can have an X-ray diffraction pattern that satisfies $I_m/I_{200} \le 0.10$, wherein $I_m$ denotes the maximum integrated intensity of diffraction peaks other than the diffraction peak(s) of a perovskite-type crystal phase that forms the primary phase, and $I_{200}$ denotes the integrated intensity for (200) of the primary phase. ($0.00 \le I_m/I_{200} \le 0.10$)

When the ceramic powder has an X-ray diffraction pattern that satisfies $I_m/I_{200} \le 0.10$, the ceramic powder consists almost entirely of the perovskite-type crystal phase that forms the primary phase, and is substantially free from other perovskite-type crystal phases, non-perovskite-type crystal phases, and amorphous phases, which can have adverse effects on the piezoelectric performance. As a result, the displacement distribution of a piezoelectric ceramic formed of a ceramic powder according to an embodiment of the present invention due to the piezoelectric effect becomes uniform in the ceramic structural body, and the piezoelectric ceramic has an improved mechanical quality factor.

The concentration ratio of crystal phases in a ceramic powder can be calculated from a proportional relationship between the X-ray diffraction intensities of the crystal phases and their concentrations. The term "integrated intensity", as used herein, refers to the integral of intensity with respect to the incident angle. Because the background noise depends on the measurement environment, the background intensity is taken as zero for the calculation of the integrated intensity.

The precision with which the concentration is calculated using a comparison method based on integrated intensity is higher than the precision in the case of a comparison method based on peak intensity at a particular incident angle.

The X-ray diffraction can be measured under any conditions and may be measured using a $2\delta$-$\theta$ method utilizing a collimated beam. Typical measurement conditions are described below.

The X-ray radiation source is a Cu-K$\alpha$ ray. Information on $I_{200}$ and $I_m$ is obtained at a $2\theta$ measurement range in the range of 10 to 80 degrees. The spot diameter of incident light depends on the area of a surface to be measured and may be such that the surface to be measured is entirely irradiated with the incident light. In order to sufficiently increase the intensity, the scan speed ranges from 0.10 to 1.00 degree/minute, and the sampling interval ranges from 0.001 to 0.020 degrees. The data thus obtained have high reproducibility. When a multi-axis X-ray diffractometer is used, the angle $\Psi$ between a surface to be measured and the normal line of incident light should be 0 degrees.

$I_{200}$ denotes the integrated intensity for (200) of a perovskite-type crystal phase that forms the primary phase.

(200) in X-ray powder diffraction refers to diffraction on a 200 crystal plane in pseudo-cubic crystal notation obtained using a $2\delta$-$\delta$ method. When diffraction peaks in the vicinity of (200) are separated into (200) and (002) or (200), (002), and (020), the integrated intensity for each peak is summed up to obtain $I_{200}$.

Diffraction peaks other than the diffraction peak of the perovskite-type crystal phase that forms the primary phase are assigned to compounds composed of Ba, Ca, Ti, Zr, Mn, subcomponent elements, and impurity elements. Examples of such compounds include, but are not limited to, $BaTiO_3$, $CaTiO_3$, $BaZrO_3$, $CaZrO_3$, $BaO$, $BaCO_3$, $CaO$, $CaCO_3$, $TiO_2$, $ZrO_2$, $MnO$, $MnO_2$, $Mn_3O_4$, and mixtures thereof. Such compounds may contain subcomponent elements and incidental impurity elements.

$I_m$ denotes the maximum integrated intensity of diffraction peaks other than the diffraction peak(s) of the perovskite-type crystal phase that forms the primary phase.

When the ceramic powder has the relationship of $I_m/I_{200} \leq 0.10$, the ceramic powder can have an X-ray diffraction pattern assigned to the single perovskite-type crystal phase. The ceramic powder preferably has the relationship of $I_m/I_{200} \leq 0.05$. Ceramics formed of such a ceramic powder can have a higher mechanical quality factor.

Particle Size and Equivalent Circular Diameter of Ceramic Powder

The particles of a ceramic powder according to an embodiment of the present invention have an average equivalent circular diameter in the range of 100 nm or more and less than 1000 nm.

When the particles of the ceramic powder have an average equivalent circular diameter in this range, a piezoelectric ceramic formed of the ceramic powder can have a high piezoelectric constant and mechanical strength. Particles having an average equivalent circular diameter of less than 100 nm tend to have a core-shell crystal structure. In the core-shell structure, the core has a tetragonal structure, and the shell has a cubic or pseudo-cubic structure. Thus, the different crystal structures coexist in one particle. Because the cubic structure crystallographically has inversion symmetry and has no piezoelectricity, the piezoelectric ceramic may have a low piezoelectric constant. When the particles of the ceramic powder have an average equivalent circular diameter of 1000 nm or more, an excessively high sintering temperature is required to form a ceramic, and the ceramic powder cannot be sintered in ordinary furnaces.

The phrase "cannot be sintered" means that the piezoelectric ceramic has a low density or contains many pores or defects. Pores and defects result in low mechanical strength.

The average equivalent circular diameter preferably ranges from 300 to 800 nm. The average equivalent circular diameter more preferably ranges from 500 to 800 nm in order to form a piezoelectric ceramic having a high density and a high piezoelectric constant.

Furthermore, 99 percent by number or more of the crystal grains of the piezoelectric ceramic can have an equivalent circular diameter of 2 µm or less. When the percentage by number of crystal grains having an equivalent circular diameter of 2 µm or less is in this range, the piezoelectric ceramic formed of a ceramic powder according to an embodiment of the present invention can have satisfactory mechanical strength.

The average equivalent circular diameter of particles of a ceramic powder in the present invention refers to a "projected area equivalent circular diameter" generally referred to in microscopy and refers to the diameter of a perfect circle having the same area as the projected area of the particles. The particle size can be measured using a zeta potential method or a laser diffraction method, as well as microscopy. However, in the measurement of the particle size of a powder containing many non-spherical irregular particles, conversion to the equivalent circular diameter by particular measurement methods or under particular measurement conditions is difficult. Microscopy can be used to directly observe the shape and accurately calculate the equivalent circular diameter.

For example, the equivalent circular diameter can be determined by microscopy by processing an image of a ceramic powder taken with a polarizing microscope or a scanning electron microscope. Although overlapping particles can be identified as individual particles by image processing, multiple measurements of the particle size of a minimum amount of powder dispersed so as not to form aggregates can ensure higher accuracy. Since the optimum magnification depends on the particle diameter to be measured, an optical microscope or an electron microscope may be selected according to the particle size. ($1.000 \leq c_1/a_1 \leq 1.010$)

A ceramic powder according to an embodiment of the present invention has a ratio $c_1/a_1$ in the range of $1.000 \leq c_1/a_1 \leq 1.010$, wherein $c_1$ and $a_1$ denote the c-axis length and a-axis length, respectively, of unit cells of the perovskite-type metal oxide, $c_1$ being greater than or equal to $a_1$.

A piezoelectric ceramic formed of a ceramic powder according to an embodiment of the present invention having a ratio $c_1/a_1$ in the range of $1.000 \leq c_1/a_1 \leq 1.010$ has a high density. A ratio $c_1/a_1$ of more than 1.010 results in low grain growth during sintering. Thus, an excessively high sintering temperature is required to form a ceramic, and the ceramic powder cannot be sintered in ordinary furnaces.

When a ceramic powder according to an embodiment of the present invention has a ratio $c_1/a_1$ in the range of $1.000 \leq c_1/a_1 \leq 1.010$, a high-density piezoelectric ceramic can be formed in an ordinary furnace.

The ratio $c_1/a_1$ is preferably in the range of $1.000 \leq c_1/a_1 \leq 1.005$. When a ceramic powder has $c_1/a_1$ in the range of $1.000 \leq c_1/a_1 \leq 1.005$, grain growth during sintering is further promoted, and the ceramic powder can form a close-grained high-density piezoelectric ceramic.

The lattice constants $a_1$ and $c_1$ of the ceramic powder can be determined from interplanar spacing, which can be obtained from diffraction peaks measured using a 2θ-θ method. The lattice constants $a_1$ and $c_1$ of the ceramic powder can be represented by the following equations, wherein λ denotes the wavelength of X-rays, $d_{(200)}$ denotes the interplanar spacing of a 200 plane, $\theta_{200}$ denotes the angle at which the diffraction peak of the 200 plane has the maximum intensity, $d_{(002)}$ denotes the interplanar spacing of a 002 plane, and $\theta_{002}$ denotes the angle at which the diffraction peak of the 002 plane has the maximum intensity. When the diffraction peaks of the 200 plane and the 002 plane are too close to separate, the lattice constants $a_1$ and $c_1$ can also be determined in the same manner from the diffraction peaks of a 400 plane and a 004 plane detected at higher angles.

$$d_{(200)} = \frac{\lambda}{2\sin\theta_{200}}$$

$$d_{(002)} = \frac{\lambda}{2\sin\theta_{002}}$$

$$a_1 = 2 \cdot d_{(200)}$$

$$c_1 = 2 \cdot d_{(002)}$$

Half-Value Width of 0.12 or More

The half-value width of a (111) diffraction peak of a ceramic powder according to an embodiment of the present invention is 0.12 degrees or more as determined by X-ray powder diffraction. (The half-value width of the diffraction peak is 90 degrees or less.)

The term "diffraction peak", as used herein, refers to an angle at which diffraction on a crystal face has the maximum intensity.

The term "half-value width", as used herein, refers to a difference between angles $\theta_2$ and $\theta_1$, wherein a diffraction peak has half the maximum intensity P at the angles $\theta_2$ and $\theta_1$ ($\theta_2 > \theta_1$) on the 2θ axis. The half-value width is also referred to as the full width at half maximum. The maximum intensity is determined by subtracting the background intensity.

When the half-value width of the (111) diffraction peak of the ceramic powder is 0.12 degrees or more, this results in a sufficient electromechanical coupling coefficient $k_{31}$. When the half-value width of the (111) diffraction peak is 0.20 or more, this facilitates grain growth, increases the sintered density, and improves mechanical strength.

When the half-value width of the (111) diffraction peak is less than 0.12 degrees, the ceramic powder has excessively high crystallinity, and it is difficult to grow grains by sintering in the formation of a piezoelectric ceramic. Thus, an excessively high sintering temperature is required to form a ceramic, and the ceramic powder cannot be sintered in ordinary furnaces.

BET Specific Surface Area of 1 or More

The ceramic powder can have a specific surface area in the range of 1 m²/g or more and less than 10 m²/g as measured using a BET method. When the ceramic powder has a specific surface area of less than 1 m²/g, an excessively high sintering temperature is required to form a ceramic, and the ceramic powder cannot be sintered in ordinary furnaces.

When the ceramic powder has a specific surface area of 10 m²/g or more as measured using the BET method, the ceramic powder tends to aggregate, and the resulting sintered piezoelectric ceramic may have an uneven density due to aggregation. An uneven density results in a nonuniform piezoelectric effect, generation of mechanical frictional heat (elastic loss) in the piezoelectric ceramic, and a low mechanical quality factor.

Thus, the ceramic powder preferably has a specific surface area of 10 m²/g or less, more preferably 7 m²/g or less, as measured using the BET method.

The specific surface area of a ceramic powder can be measured using the BET method. In the BET method, the specific surface area can be determined from the amount of adsorbed molecules having a known molecular size, such as nitrogen ($N_2$). More specifically, the specific surface area can be determined in accordance with Japanese Industrial Standards JIS 8830.

Ceramic Powder Represented by General Formula (1) and Crystal Phase Thereof

The general formula (1) is as follows:

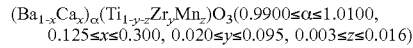
$(Ba_{1-x}Ca_x)_\alpha(Ti_{1-y-z}Zr_yMn_z)O_3$ ($0.9900 \leq \alpha \leq 1.0100$, $0.125 \leq x \leq 0.300$, $0.020 \leq y \leq 0.095$, $0.003 \leq z \leq 0.016$)

This general formula is based on the assumption that Ba, Ca, Ti, Zr, and Mn contained in a ceramic powder according to an embodiment of the present invention are entirely contained in a perovskite-type crystal phase that forms the primary phase. More specifically, as long as $I_m/I_{200} \leq 0.10$ is satisfied, a ceramic powder according to an embodiment of the present invention may contain a minute amount of Ba, Ca, Ti, Zr, and/or Mn in another perovskite-type crystal phase or in the form of another oxide without losing the advantages of the present invention.

Focusing on the crystal phase of the perovskite-type crystal represented by the general formula (1), Ba of perovskite-type barium titanate is partly substituted with Ca. Ti of the barium titanate is partly substituted with Zr. Owing to the synergistic effect of these multiple substitutions, in a ceramic powder according to an embodiment of the present invention, the decrease in depolarization temperature can be suppressed, and the piezoelectric constant can be significantly improved, as compared with pure barium titanate.

The variable α in the general formula (1), which represents the ratio of the number of moles of Ba and Ca at the A site to the number of moles of Ti, Zr, and Mn at the B site, is in the range of $0.9900 \leq \alpha \leq 1.0100$. In the formation of a ceramic by sintering, α of less than 0.9900 tends to result in abnormal growth of crystal grains in the ceramic and low mechanical strength of the ceramic. When α is more than 1.0100, an excessively high sintering temperature is required to form a ceramic, and the ceramic powder cannot be sintered in ordinary furnaces.

Ca Content of Ceramic Powder

The mole ratio x of Ca at the A site in the general formula (1) is in the range of $0.125 \leq x \leq 0.300$. Partial substitution of Ca for Ba of the perovskite-type barium titanate within this range decreases the phase transition temperature between orthorhombic crystals and tetragonal crystals. Thus, a piezoelectric element manufactured from a ceramic powder according to an embodiment of the present invention can have a stable piezoelectric constant in the device operation temperature range (−30° C. to 50° C.).

However, when x is more than 0.300, a piezoelectric ceramic formed of a ceramic powder according to an embodiment of the present invention has a low piezoelectric constant. When x is less than 0.125, a piezoelectric element manufactured from a ceramic powder according to an embodiment of the present invention has a large variation in piezoelectric constant with temperature in the operation temperature range.

Zr Content of Ceramic Powder

The mole ratio y of Zr at the B site in the general formula (1) is in the range of $0.020 \leq y \leq 0.095$. Partial substitution at the Ti site with Zr within this range results in a decrease in tetragonal crystal strain of a ceramic powder, a low $c_1/a_1$ close to 1, and an increased piezoelectric constant. A mole ratio y of more than 0.095 results in a decreased depolarization temperature and insufficient high-temperature durability. A mole ratio y of less than 0.020 results in a low piezoelectric constant in the device operation temperature range.

The mole ratio y is preferably in the range of $0.055 \leq y \leq 0.085$. A mole ratio y of 0.055 or more results in a further improved piezoelectric constant. On the other hand, y of 0.085 or less results in a higher depolarization temperature and a wider operating temperature range of a piezoelectric ceramic formed of a ceramic powder according to an embodiment of the present invention. (See below for depolarization temperature.)

Mn Content of Ceramic Powder

The mole ratio z of Mn at the B site in the general formula (1) is in the range of $0.003 \leq z \leq 0.016$.

When the Mn content of the ceramic powder is in this range, a piezoelectric element manufactured from the ceramic powder has an improved insulation property and mechanical quality factor throughout the operation temperature range without a decrease in piezoelectric constant.

A mole ratio z of less than 0.003 results in an insufficient insulation property and mechanical quality factor in the device operation temperature range. On the other hand, z of 0.016 or more results in a low piezoelectric constant in the device operation temperature range.

The Mn content is preferably in the range of $0.004 \leq z \leq 0.008$. When a piezoelectric element according to an embodiment of the present invention has a resistivity of 1 GΩ·cm or more, the leakage current can be decreased in polarization treatment and in the operation of the piezoelectric element. The resistivity is preferably 10 GΩ·cm or more. A piezoelectric ceramic according to an embodiment of the present invention preferably has a mechanical quality factor of 1000 or more, more preferably 1500 or more. A piezoelectric element manufactured from a piezoelectric ceramic having a mechanical quality factor of less than 1000 may consume more power in resonant driving.

The composition of a ceramic powder according to an embodiment of the present invention may be determined by any method. The method may be X-ray fluorescence spectroscopy, ICP spectroscopy, or atomic absorption spectrometry. The weight ratio and mole ratio of the elements of the ceramic powder can be determined by any of these methods.

Because these methods give the entire composition of the ceramic powder, the resulting composition ratio includes auxiliary components and impurity components. However, as described above, provided that the ceramic powder has an X-ray diffraction pattern assigned to a single perovskite-type crystal phase, and the main component elements Ba, Ca, Ti, Zr, and Mn of the ceramic powder satisfy the composition ratio of the general formula (1), the advantages of the present invention are effective even in the presence of a very small amount of auxiliary components and impurities.

In other words, although the general formula (1) represents a chemical formula of a perovskite-type metal oxide $ABO_3$, the ceramic powder may contain a minute amount of oxide not represented by the general formula (1) (for example, $AO_2$, $ACO_3$, $BO_2$, or $B_3O_4$) as an auxiliary component. Even in such a case, the ceramic powder is considered to have a composition represented by the general formula (1).

Mg, Fe, Al, and Sr Components

A ceramic powder according to an embodiment of the present invention can contain more than 0 and not more than 0.1 parts by weight on a metal basis of at least one element of Mg, Fe, Al, and Sr per 100 parts by weight of the ceramic powder.

A piezoelectric ceramic according to an embodiment of the present invention can contain more than 0 and not more than 0.1 parts by weight on a metal basis of at least one element of Mg, Fe, Al, and Sr per 100 parts by weight of the piezoelectric ceramic.

On Metal Basis

The auxiliary component content "on a metal basis" refers to the weight of metal (Mg, Fe, Al, or Sr) per 100 parts by weight of the constituent elements of a metal oxide represented by the general formula (1) on an oxide basis. The weight of each constituent element of the metal oxide on an oxide basis is calculated from the metal contents of a ceramic powder or piezoelectric ceramic, for example, measured by X-ray fluorescence (XRF) spectroscopy, ICP spectroscopy, or atomic absorption spectrometry.

The Mg content of a ceramic powder according to an embodiment of the present invention can be more than 0 parts by weight and 0.10 parts by weight or less on a metal basis per 100 parts by weight of the perovskite-type metal oxide.

A piezoelectric ceramic formed of a ceramic powder according to an embodiment of the present invention having a Mg content in this range has a high mechanical quality factor and force factor. The term "force factor", as used herein, refers to a coefficient represented by a product of the piezoelectric constant $(d_{31})$ and Young's modulus $(Y_{11})$ $(|d_{31} \times Y_{11}|)$ and means the generative force of a piezoelectric strain in a direction perpendicular to the direction of an electric field applied for driving.

Thus, the Mg content of a piezoelectric ceramic according to an embodiment of the present invention can also be more than 0 parts by weight and 0.10 parts by weight or less on a metal basis per 100 parts by weight of the perovskite-type metal oxide.

A Mg content of more than 0.10 parts by weight may result in a low mechanical quality factor of less than 1100. This may also result in a low force factor of less than 10 (N/V·m). When a piezoelectric element manufactured from a piezoelectric ceramic formed of such a ceramic powder operates as a resonant device, a low mechanical quality factor results in high power consumption.

The force factor suitable for a piezoelectric ceramic is 10 (N/Vm) or more. A force factor of less than 10 results in a small generative force, a high electric field for driving a piezoelectric element, and high power consumption. When the mechanical quality factor and the force factor are in the ranges described above, the power consumption in the practical operation of a piezoelectric element is not extremely increased.

In order to further increase the mechanical quality factor and force factor, the Mg content of a ceramic powder or a piezoelectric ceramic is preferably 0.05 parts by weight or less, more preferably 0.0005 parts by weight or more and 0.007 parts by weight or less.

The Fe, Al, and Sr oxides have an effect of improving the piezoelectric constant. Each of the Fe, Al, and Sr contents of a ceramic powder or a piezoelectric ceramic can be in the range of more than 0 and not more than 0.1 parts by weight on a metal basis per 100 parts by weight of the ceramic powder. In order to improve the constancy of the piezoelectric constant in the operation temperature range, the Fe content preferably ranges from 0.0001 to 0.0220 parts by weight, more preferably 0.0005 to 0.0120 parts by weight, the Al content preferably ranges from 0.0001 to 0.025 parts by weight, more preferably 0.0005 to 0.014 parts by weight, and the Sr content preferably ranges from 0.0001 to 0.017 parts by weight, more preferably 0.0005 to 0.009 parts by weight.

Fe, Al, and Sr contents of more than 0.1 parts by weight on a metal basis may result in an insufficient effect of improving the piezoelectric constant.

A ceramic powder or piezoelectric ceramic according to an embodiment of the present invention contains at least one of Mg, Fe, Al, and Sr as a metal or in another form. For example, Mg, Fe, Al, and/or Sr may be dissolved in the A or B site of the perovskite structure or may be contained in a boundary between crystal grains (hereinafter referred to as a grain boundary). A ceramic powder may contain Mg, Fe, Al, and/or Sr in the form of metal, ion, oxide, metal salt, or complex.

Si Component

A ceramic powder according to an embodiment of the present invention may contain Si or B in order to decrease the firing temperature. In the manufacture of a multilayered piezoelectric element from a ceramic powder, the ceramic powder is sintered together with an electrode material. In general, electrode materials have a lower heat resistant temperature than ceramic powders. Thus, a lower firing temperature of a ceramic powder results in smaller sintering energy and more choices of electrode materials. For example, a ceramic powder can contain 0.001 to 4.000 parts by weight of Si and/or B per 100 parts by weight of a perovskite-type metal oxide. However, an excessively high Si content results in a low piezoelectric constant. Thus, in order to maintain a high piezoelectric constant, the Si content preferably ranges from 0.001 to 0.020 parts by weight. Within this range, the decrease in piezoelectric constant can be 10% or less.

Bi Component

A ceramic powder according to an embodiment of the present invention can contain Bi. The Bi content preferably ranges from 0.042 to 0.850 parts by weight on a metal basis per 100 parts by weight of a metal oxide represented by the general formula (1).

When a ceramic powder composed of a metal oxide represented by the general formula (1) has a Bi content in this range, the mechanical quality factor is significantly improved particularly at low temperatures (for example, −30° C.) without a decrease in piezoelectric constant. It is supposed that Bi, which is stable as trivalent Bi, is mostly disposed at the A site, and the remaining Bi is disposed at the B site or crystal grain boundaries. A ceramic powder containing Bi mostly at the A site can have a high mechanical quality factor even when the ceramic powder has an orthorhombic crystal structure. When a ceramic powder has a tetragonal crystal structure, a minute amount of Bi at the B site has a valence different from that of Ti or Zr (mainly tetravalent). This allows defect dipoles (the origins of internal electric fields) to be introduced into a crystal lattice, thereby improving the mechanical quality factor. Thus, the addition of Bi can improve the mechanical quality factor in an orthorhombic or tetragonal crystal structure. A ceramic powder according to an embodiment of the present invention containing a proper amount of Bi can have a high mechanical quality factor in the device operation temperature range.

A Bi content of less than 0.042 parts by weight unfavorably results in a mechanical quality factor of less than 400 at low temperatures (for example, −30° C.). A Bi content of more than 0.850 parts by weight unfavorably results in a low piezoelectric constant. In order to improve the mechanical quality factor and the piezoelectric constant in the device operation temperature range (−30° C. to 50° C.), the Bi content preferably ranges from 0.100 to 0.850 parts by weight, more preferably 0.100 to 0.480 parts by weight.

Bi in a ceramic powder according to an embodiment of the present invention is not limited to metal Bi and may be in any form. For example, Bi may be dissolved in the A site or the B site or may be contained in a grain boundary. A Bi component in a ceramic powder may be in the form of metal, ion, oxide, metal salt, or complex.

Raw Materials of Ceramic Powder

A ceramic powder according to an embodiment of the present invention can be manufactured using a common solid state sintering method that includes sintering a mixture of raw materials, such as oxides, carbonates, nitrates, and/or oxalates containing constituent elements of the ceramic powder, at atmospheric pressure. The raw materials can be of high purity. The raw materials may be powders or liquids of metal oxides and/or metal salts constituting the ceramic powder. Examples of the raw materials include, but are not limited to, metallic compounds, such as Ba compounds, Ca compounds, Ti compounds, Zr compounds, Mg compounds, Mn compounds, Fe compounds, Al compounds, Sr compounds, and Bi compounds.

When the raw materials of a ceramic powder according to an embodiment of the present invention are powdered raw materials, these compounds can be powdered raw materials having a particle size in the range of 10 nm to 10 μm in order to improve uniformity. Among Ba compounds, Ca compounds, Ti compounds, and Zr compounds, which account for a high percentage of the raw materials, when at least one of these compounds has a particle size of 100 nm or less, the particle size of the ceramic powder after sintering can be easily controlled.

Examples of the Ba compounds include, but are not limited to, barium oxide, barium carbonate, barium oxalate, barium acetate, barium nitrate, barium titanate, barium zirconate, and barium zirconate titanate. The Ba compound can be of a commercially available high purity type (for example, a purity of 99.99% or more). A low-purity Ba compound contains a large amount of Mg, Fe, Al, and Sr, which may lower the mechanical quality factor of a piezoelectric ceramic.

Examples of the Ca compounds include calcium oxide, calcium carbonate, calcium oxalate, calcium acetate, calcium titanate, calcium zirconate, and calcium zirconate titanate. The Ca compound can be of a commercially available high purity type (for example, a purity of 99.99% or more). A low-purity Ca compound contains a large amount of Mg and Sr, which may lower the mechanical quality factor of a piezoelectric ceramic.

Examples of the Ti compounds include, but are not limited to, titanium oxide, barium titanate, barium zirconate titanate, and calcium titanate.

Examples of the Zr compounds include, but are not limited to, zirconium oxide, barium zirconate, barium zirconate titanate, and calcium zirconate.

A ceramic powder according to an embodiment of the present invention may be manufactured from a perovskite-type metal oxide powder, such as a $BaTiO_3$ powder, a $CaTiO_3$ powder, a $BaZrO_3$ powder, or a $CaZrO_3$ powder, as a raw material.

Examples of the Mn compounds include, but are not limited to, manganese carbonate, manganese oxide, manganese dioxide, manganese acetate, and trimanganese tetroxide.

Examples of the Mg compounds include magnesium carbonate, magnesium oxide, magnesium hydroxide, magnesium peroxide, and magnesium chloride.

Examples of the Fe compounds include, but are not limited to, iron oxide, tri-iron tetroxide, iron chloride, iron sulfide, iron sulfate, and iron nitrate.

Examples of the Al compounds include, but are not limited to, aluminum carbonate, aluminum oxide, aluminum hydroxide, hydrogenated aluminum, aluminum chloride, aluminum nitride, and aluminum sulfate.

Examples of the Sr compounds include, but are not limited to, strontium oxide, strontium hydroxide, and strontium chloride.

Examples of the Bi compounds include, but are not limited to, bismuth oxide and bismuth chloride.

Because the Mg, Fe, Al, and Sr contents are very low, when any of the Ba, Ca, Zr, Ti, and Mn compounds contains moderate amounts of Mg, Fe, Al, and Sr as impurities, the addition of Mg, Fe, Al, and Sr may be unnecessary.

A raw material for adjusting the ratio a of the total number of moles of Ba and Ca at the A site to the total number of moles of Ti, Zr, and Mn at the B site of a ceramic powder is not particularly limited. Ba compounds, Ca compounds, Ti compounds, Zr compounds, and Mn compounds have the same effect.

Method for Manufacturing Ceramic Powder

A method for manufacturing a ceramic powder according to an embodiment of the present invention is not particularly limited. A ceramic powder according to an embodiment of the present invention is manufactured through heat treatment of a mixture of the raw materials such that the ceramic powder is composed of a metal oxide represented by the following general formula (1).

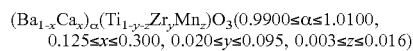
(0.9900≤α≤1.0100, 0.125≤x≤0.300, 0.020≤y≤0.095, 0.003≤z≤0.016)

Variations in a have a great influence on the characteristics. Thus, the precision with which the raw materials are weighed can be in the order of one thousandth of the amount of the ceramic powder. When the ceramic powder has a composition deviated from the desired composition, the composition can be adjusted by means of subsequent addition.

A ceramic powder according to an embodiment of the present invention is composed so as to have an X-ray diffraction pattern assigned to a single perovskite-type crystal phase. Thus, the raw materials are mixed so as to satisfy the desired composition and are subjected to heat treatment and a chemical reaction. The temperature, heating rate, holding time, and cooling rate in the heat treatment depend on the particle size of the raw materials.

The particles of a ceramic powder according to an embodiment of the present invention have an average equivalent circular diameter in the range of 100 nm or more and less than 1000 nm. In general, heat treatment increases the particle size of a powder. Thus, when at least one of a Ba compound, a Ca compound, a Ti compound, a Zr compound, a Mg compound, and a Mn compound of the raw materials has a particle size of less than 100 nm, the average equivalent circular diameter of the particles of the ceramic powder can be easily adjusted to be less than 1000 nm even when the raw materials are subjected to sufficient heat treatment.

Although sufficient heat treatment facilitates the formation of a single perovskite-type crystal phase, this also increases the particle size. Thus, the particles of a ceramic powder according to an embodiment of the present invention sometimes cannot have an average equivalent circular diameter in the range of 100 nm or more and less than 1000 nm only by changing the temperature and/or time of heat treatment. In other words, the heat-treatment conditions for forming a single perovskite-type crystal phase in the ceramic powder may be different from the heat-treatment conditions for adjusting the average equivalent circular diameter in the range of 100 nm or more and less than 1000 nm. In such a case, a ceramic powder is first manufactured under the heat-treatment conditions for forming a single perovskite-type crystal phase, although the particles have an average equivalent circular diameter greater than the desired size. After that, the ceramic powder can be pulverized, for example, in a ball mill or a bead mill or by a collision of gases containing the ceramic powder. Particles having the desired particle size may be filtered out by classification.

A piezoelectric ceramic according to an embodiment of the present invention is formed by firing the ceramic powder.

Granulated Powder and Compact

When a ceramic powder for a piezoelectric ceramic according to an embodiment of the present invention is formed into a ceramic (sintered body), a compact for firing is first formed. The compact is a solid body formed of a ceramic powder.

The compact can be formed by uniaxial pressing, cold hydrostatic pressing, hot hydrostatic pressing, casting, or extrusion molding. The compact can be formed of a granulated powder. Sintering of the compact formed of a granulated powder has an advantage that the grain size distribution of the sintered body tends to become uniform.

The ceramic powder may be granulated by any method. Spray drying can make the particle size of the granulated powder more uniform.

A binder for use in granulation may be polyvinyl alcohol (PVA), polyvinyl butyral (PVB), or an acrylic resin. The amount of binder preferably ranges from 1 to 10 parts by weight relative to the total weight of the ceramic powder of the piezoelectric material, more preferably 2 to 5 parts by weight in order to increase the compact density.

Sintering

A method for firing a ceramic powder according to an embodiment of the present invention to form a piezoelectric ceramic is not particularly limited. Examples of the sintering method include, but are not limited to, sintering in an electric furnace, sintering in a gas furnace, electric heating, microwave sintering, millimeter-wave sintering, and hot isostatic pressing (HIP). Sintering in an electric furnace or a gas furnace may be performed in a continuous furnace or a batch furnace. The sintering temperature of a ceramic powder in the sintering method is not particularly limited and may be a temperature at which the compounds can react and grains can grow sufficiently. The sintering temperature preferably ranges from 1200° C. to 1550° C., more preferably 1300° C. to 1480° C., in order that the ceramic grain size ranges from 1 to 10 μm.

A piezoelectric ceramic sintered in this temperature range has satisfactory piezoelectric performance. In order to ensure the reproducibility and stability of the characteristics of a piezoelectric ceramic manufactured by sintering, sintering may be performed at a constant temperature within the range described above for 2 hours or more and 48 hours or less. Although two-step sintering may also be performed, a sintering method without an abrupt temperature change can improve productivity. The piezoelectric ceramic can be polished and then heat-treated at a temperature of 1000° C. or more. Heat treatment of the piezoelectric ceramic at a temperature of 1000° C. or more can relieve the residual stress of the piezoelectric ceramic resulting from mechanical polishing and thereby improves the piezoelectric constant of the piezoelectric ceramic. Heat treatment of the piezoelectric ceramic can also remove the raw material powder, such as barium carbonate, precipitated at grain boundaries. The heat-treatment time can be, but is not limited to, 1 hour or more.

The average equivalent circular diameter of crystal grains of a piezoelectric ceramic according to an embodiment of the present invention can be greater than the average equivalent circular diameter of particles of the ceramic powder.

Crystal Grain Size and Equivalent Circular Diameter

The average equivalent circular diameter of crystal grains of a piezoelectric ceramic according to an embodiment of the present invention can be greater than the average equivalent circular diameter of particles of the ceramic powder.

An average equivalent circular diameter of crystal grains of a piezoelectric ceramic greater than the average equivalent circular diameter of particles of the ceramic powder results in a high density and mechanical strength of the sintered piezoelectric ceramic.

Grain growth during a firing process decreases the distance between crystal grains and increases the strength between the crystal grains. This increases the density of the sintered piezoelectric ceramic and improves the mechanical strength of the piezoelectric ceramic.

The term "equivalent circular diameter of crystal grains", as used herein, refers to a "projected area equivalent circular diameter" generally referred to in microscopy and refers to the diameter of a perfect circle having the same area as the projected area of a crystal grain. In the present invention, the equivalent circular diameter may be determined by any method. For example, the grain size may be determined by processing an image of a surface of the piezoelectric ceramic taken with a polarizing microscope or a scanning electron microscope. Since the optimum magnification depends on the grain size to be measured, an optical microscope or an electron microscope may be selected according to the grain size. The equivalent circular diameter may be determined from an image of a polished surface or a cross section rather than the surface of the material.

Average Equivalent Circular Diameter of Crystal Grains of Piezoelectric Ceramic

The average equivalent circular diameter of crystal grains of a piezoelectric ceramic according to an embodiment of the present invention preferably ranges from 0.3 to 10 m. Having an average equivalent circular diameter of crystal grains in this range, the piezoelectric ceramic can have a high piezoelectric constant and mechanical strength. An average equivalent circular diameter of less than 0.3 μm may result in a low piezoelectric constant. An average equivalent circular diameter of more than 10 μm may result in low mechanical strength. The average equivalent circular diameter more preferably ranges from 1 to 5 μm.

Furthermore, 99 percent by number or more of the crystal grains of the piezoelectric ceramic can have an equivalent circular diameter of 25 μm or less. When the percentage by number of crystal grains having an equivalent circular diameter of 25 μm or less is in this range, the piezoelectric ceramic can have satisfactory mechanical strength. The mechanical strength has a strong negative correlation with the percentage of crystal grains having a large equivalent circular diameter. When the percentage by number of crystal grains having an equivalent circular diameter of 25 μm or less is less than 99 percent by number, this results in an increase in the number of crystal grains having an equivalent circular diameter of more than 25 μm, possibly resulting in low mechanical strength.

The piezoelectric ceramic may contain needle crystals having a long side of more than 25 μm. Also in such a case, 99 percent by number or more of the crystal grains of the piezoelectric ceramic can have an equivalent circular diameter of 25 μm or less.

The ratio $c_2/a_2$ can be greater than the ratio $c_1/a_1$ of particles of the ceramic powder, wherein $c_2$ and $a_2$ denote the c-axis length and a-axis length, respectively, of unit cells of a piezoelectric ceramic according to an embodiment of the present invention, $c_2$ being greater than or equal to $a_2$.

A ratio $c_2/a_2$ of the piezoelectric ceramic higher than the $c_1/a_1$ of particles of the ceramic powder results in a high density and mechanical strength of the sintered piezoelectric ceramic. When the firing temperature for forming a ceramic is higher than the highest firing temperature in the manufacture of the raw materials, grains can grow from the ceramic powder, and $c_2/a_2$ is increased.

The lattice constants $a_2$ and $c_2$ of the piezoelectric ceramic can be determined in the same manner as in the lattice constants of the ceramic powder described above.

Relative Density

A piezoelectric ceramic according to an embodiment of the present invention preferably has a relative density in the range of 93% to 100%. The relative density is the ratio of the measured density to the theoretical density, which is calculated from the lattice constants of the piezoelectric powder and the atomic weights of the constituent elements of the ceramic. The lattice constants can be measured by X-ray diffraction analysis. The density can be measured in accordance with Archimedes' principle. A relative density of less than 93% may result in a low piezoelectric constant, a low mechanical quality factor, or poor insulation property. The lower limit of the relative density is more preferably 94% or more, still more preferably 95% or more.

A piezoelectric ceramic according to an embodiment of the present invention is composed mainly of a perovskite-type metal oxide represented by the general formula (2), wherein the metal oxide contains manganese, and the Mn content ranges from 0.02 to 0.40 parts by weight on a metal basis per 100 parts by weight of the metal oxide.

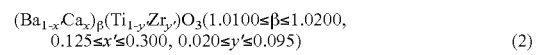

$$(Ba_{1-x}Ca_x)_\beta(Ti_{1-y'}Zr_{y'})O_3 (1.0100 \leq \beta \leq 1.0200, 0.125 \leq x' \leq 0.300, 0.020 \leq y' \leq 0.095) \qquad (2)$$

Piezoelectric Ceramic Represented by General Formula (2)

A piezoelectric ceramic according to an embodiment of the present invention is composed of a metal oxide represented by the general formula (2), wherein Ba of perovskite-type barium titanate is partly substituted with Ca. More than 2% by mole of Ti of the barium titanate is substituted with Zr. Owing to the synergistic effect of these metal components, in a piezoelectric ceramic according to an embodiment of the present invention, the decrease in depolarization temperature can be suppressed, and the piezoelectric constant can be significantly improved, as compared with pure barium titanate.

The variable β in the general formula (2), which represents the ratio of the number of moles of Ba and Ca at the A site to the number of moles of Ti and Zr at the B site of crystals of a piezoelectric ceramic, is in the range of 1.0100≤β≤1.0200. β in this range results in a higher piezoelectric constant.

When β is more than 1.0200, an excessively high sintering temperature is required to form a ceramic, and the ceramic powder cannot be sintered in ordinary furnaces.

Ca Content of Piezoelectric Ceramic

The mole ratio x' of Ca at the A site in the general formula (2) is in the range of 0.125≤x'≤0.300. Partial substitution of Ca for Ba of the perovskite-type barium titanate within this range decreases the phase transition temperature between orthorhombic crystals and tetragonal crystals. Thus, a piezoelectric element manufactured from a piezoelectric ceramic according to an embodiment of the present invention can have a stable piezoelectric constant in the operation temperature range.

However, x' of more than 0.300 results in a low piezoelectric constant of the piezoelectric ceramic. When x' is less than 0.125, a piezoelectric element manufactured from a piezoelectric ceramic according to an embodiment of the present invention has a large variation in piezoelectric constant with temperature in the operation temperature range. Zr Content of Piezoelectric Ceramic The mole ratio y' of Zr at the B site in the general formula (2) is in the range of 0.020≤y'≤0.095. Partial substitution at the Ti site with Zr within this range results in a decrease in tetragonal crystal strain of a piezoelectric ceramic, a low $c_2/a_2$ close to 1, and an increased piezoelectric constant. A mole ratio y' of more than 0.095 results in a decreased depolarization temperature and insufficient high-temperature durability. A mole ratio y' of less than 0.020 results in a low piezoelectric constant in the device operation temperature range.

The mole ratio y' is preferably in the range of 0.055≤y'≤0.085. A mole ratio y' of 0.055 or more results in a further improved piezoelectric constant. On the other hand, y' of 0.085 or less results in a higher depolarization temperature and a wider operating temperature range.

Mn Content of Piezoelectric Ceramic

A piezoelectric ceramic according to an embodiment of the present invention preferably contains 0.04 to 0.40 parts by weight on a metal basis of Mn as an auxiliary component per 100 parts by weight of a metal oxide represented by the general formula (2). When the Mn content of the piezoelectric ceramic is in this range, a piezoelectric element manufactured from the piezoelectric ceramic has an improved insulation property and mechanical quality factor throughout the operation temperature range without a decrease in piezoelectric constant.

The composition of a piezoelectric ceramic according to an embodiment of the present invention may be determined by any method. The method may be X-ray fluorescence spectroscopy, ICP spectroscopy, or atomic absorption spectrometry. The weight ratio and mole ratio of the elements of the piezoelectric ceramic can be determined by any of these methods.

Polishing

The ceramic (sintered body) can be directly used as a piezoelectric ceramic according to an embodiment of the present invention. The sintered body may be polished so as to have a desired shape.

Thickness of Piezoelectric Ceramic

A piezoelectric ceramic according to an embodiment of the present invention preferably has a thickness in the range of 100 m to 10 mm, more preferably 200 μm to 5 mm. The thickness is a distance between two polished flat surfaces of the piezoelectric ceramic. When the thickness is less than 100 μm, a defect of the ceramic caused by processing may have a significant adverse effect on the piezoelectric constant. When the thickness is more than 10 mm, a piezoelectric element manufactured from a piezoelectric ceramic according to an embodiment of the present invention may not have a sufficient effect of improving the piezoelectric constant due to polarization treatment.

A piezoelectric ceramic having a thickness of less than 100 m may be used in a multilayered piezoelectric element. A piezoelectric ceramic having a thickness of less than 100 μm may be manufactured using a sheet forming and sintering method. The sheet forming method may be a doctor blade method. In accordance with the doctor blade method, a slurry is applied to a substrate with a doctor blade and is dried to form a sheet-like compact. The thickness of the compact is not particularly limited and may be adjusted to the thickness of the multilayered piezoelectric element. The thickness of the compact can be increased with increasing viscosity of the slurry.

Mechanical Quality Factor

The term "mechanical quality factor", as used herein, refers to a coefficient that represents elastic loss resulting from vibration in the evaluation of a piezoelectric ceramic as an oscillator. The mechanical quality factor corresponds to the sharpness of a resonance curve in impedance measurement. In other words, the mechanical quality factor is a coefficient that represents the sharpness of resonance of an oscillator. Improvement in the insulation property or mechanical quality factor of a piezoelectric ceramic ensures the long-term reliability in the operation of a piezoelectric element manufactured from the piezoelectric ceramic.

Depolarization Temperature

In the present specification, after a sufficient time has elapsed from polarization treatment, if the piezoelectric constant of a piezoelectric ceramic is decreased to less than 90% of the initial piezoelectric constant by increasing the temperature of the piezoelectric ceramic from room temperature to a temperature $T_d$ (° C.) and then decreasing the temperature to room temperature, the temperature $T_d$ is referred to as a depolarization temperature.

In order to maintain the piezoelectric constant of a piezoelectric element according to an embodiment of the present invention even in a high-temperature atmosphere, and in order to prevent a decrease in piezoelectric constant due to heat generated by heating in a device fabrication process or by the operation of the device, the depolarization temperature of a piezoelectric ceramic according to an embodiment of the present invention is preferably 100° C. or more, more preferably 105° C. or more, still more preferably 110° C. or more. The depolarization temperature of a piezoelectric element according to an embodiment of the present invention depends on the composition parameters α, x, y, and z, the Bi content, the crystallinity of the piezoelectric ceramic, and microscopic compositional homogeneity.

Piezoelectric Element

FIG. 1A is a schematic view of a piezoelectric element according to an embodiment of the present invention. The piezoelectric element includes a first electrode 1, a piezoelectric ceramic 2, and a second electrode 3. The piezoelectric ceramic 2 is a piezoelectric ceramic according to an embodiment of the present invention. Another electrode may be disposed on the piezoelectric ceramic 2. The piezoelectric ceramic 2 can be formed of a piece of piezoelectric ceramic. A piece of piezoelectric ceramic is a seamless piezoelectric ceramic. Pieces of piezoelectric ceramic can be produced by simultaneously firing the raw materials having the same composition. The arrow illustrated in the piezoelectric ceramic 2 schematically indicates the direction of remanent polarization of the piezoelectric ceramic 2.

The piezoelectric ceramic 2 between the first electrode 1 and the second electrode 3 has a remanent polarization region. The remanent polarization region may be the whole or part of the piezoelectric ceramic 2 between the first electrode 1 and the second electrode 3. When the remanent polarization region is the whole of the piezoelectric ceramic 2 between the first electrode 1 and the second electrode 3, the piezoelectric constant can be improved. Remanent polarization is polarization retained by the piezoelectric ceramic 2 in the absence of an external electric field. Polarization treatment of the piezoelectric ceramic 2 makes the spontaneous polarization direction unidirectional and generates remanent polarization. Whether or not the piezoelectric ceramic 2 has remanent polarization can be determined by applying an electric field between the first electrode 1 and the second electrode 3 of the piezoelectric element and measuring the relationship between the applied electric field E and polarization P (a P-E hysteresis curve). When a piezoelectric ceramic of a piezoelectric element according to an embodiment of the present invention has unidirectional remanent polarization, the piezoelectric element has a high piezoelectric constant due to the unidirectional dipole moment of polarization involved in piezoelectric actuation.

Figure 1B:
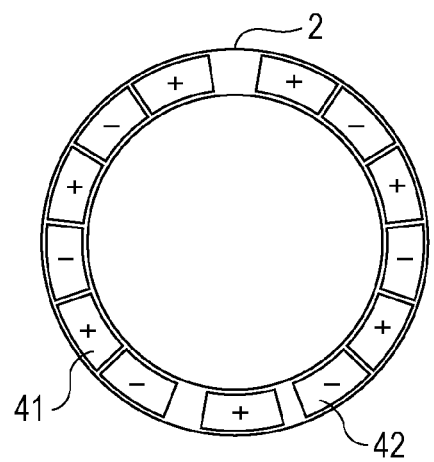
Figure 1C:
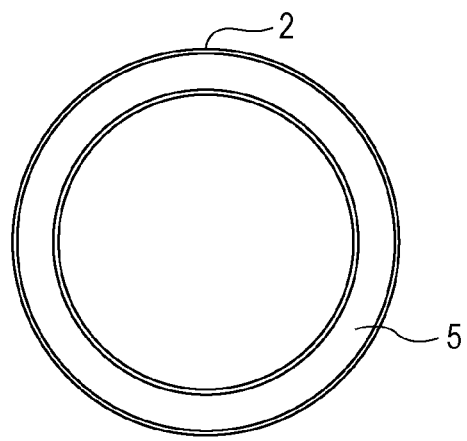

FIGS. 1B and 1C are schematic views of a piezoelectric element according to another embodiment of the present invention. FIG. 1B is a schematic view of the shape of an electrode and the polarity of remanent polarization when viewed from one side of a piezoelectric element according to an embodiment of the present invention. FIG. 1C is a schematic view of the shape of an electrode when viewed from the other side of the piezoelectric element. The piezoelectric element illustrated in FIGS. 1B and 1C includes a piece of toric piezoelectric ceramic 2, a plurality of electrodes 41 and 42 (and electrodes having no reference numerals) disposed on one side of the piezoelectric ceramic 2, and a common electrode 5 disposed on the other side of the piezoelectric ceramic 2. The "+" and "−" signs in the electrodes 41 and 42 in FIG. 1B indicate the polarity of remanent polarization in the piezoelectric ceramic between the corresponding electrode and the opposite common electrode. In the present specification, the "+" sign indicates an electrode to which a positive electric field is applied in polarization treatment in a process of manufacturing the piezoelectric element. Thus, the piezoelectric constant $d_{33}$ measured only for the "+" electrodes has a negative value. Likewise, the piezoelectric constant $d_{33}$ measured only for the "−" electrodes has a positive value. In a region having no electrode in FIG. 1B or in a region of the piezoelectric ceramic between an electrode having no remanent polarization and the opposite common electrode 5 (not shown in FIG. 1B), the piezoelectric constant $d_{33}$ is zero or very small, for example, 5 pC/N or less. In the piezoelectric element illustrated in FIG. 1B, the piezoelectric ceramic 2 includes a first region having remanent polarization downward in the drawing and a second region having remanent polarization upward in the drawing. Different polarities of remanent polarization between the first region and the second region may be confirmed by whether the piezoelectric constant measured is positive or negative or by whether the shift directions of a coercive field are opposite with respect to the origin in a P-E hysteresis curve.

A piezoelectric element according to an embodiment of the present invention that includes the first region and the second region having remanent polarization of different polarities as illustrated in FIGS. 1B and 1C can form vibrational waves along the circle. This is because simultaneous application of an electric field to the first region and the second region makes one of the regions longer and the other shorter along the circle due to the piezoelectric effect.

Electrode

Having the first electrode 1 and the second electrode 3 illustrated in FIG. 1A or the electrodes 41 and 42 and the common electrode 5 illustrated in FIGS. 1B and 1C, a piezoelectric element according to an embodiment of the present invention can perform piezoelectric actuation, which converts electrical energy into mechanical energy.

These electrodes are formed of an electrically conductive layer having a thickness in the range of approximately 5 to 2000 nm. The material of each of the electrodes is not particularly limited and may be any material that is commonly used for piezoelectric elements. Examples of such a material include, but are not limited to, metals, such as Ti, Pt, Ta, Ir, Sr, In, Sn, Au, Al, Fe, Cr, Ni, Pd, Ag, and Cu, and compounds thereof.

The electrodes may be formed of one of the materials or may be a multilayer electrode formed of two or more of the materials. The electrodes of the piezoelectric element may be formed of different materials.

The electrodes may be formed by any method, for example, by baking a metal paste, such as silver, or through a sputtering process or a vapor deposition process. Like the piezoelectric element illustrated in FIG. 1B, the electrodes may be patterned in a desired shape if necessary.

Polarization Treatment

Remanent polarization in a piezoelectric element according to an embodiment of the present invention may be generated by any polarization method. The piezoelectric element may be polarized in the ambient atmosphere or in a silicone oil. The polarization temperature preferably ranges from 60° C. to 150° C. The optimum conditions for polarization may vary with the composition of the piezoelectric ceramic of the piezoelectric element. The electric field applied for polarization treatment preferably ranges from 0.5 to 7.0 kV/mm, more preferably 0.5 to 2.0 kV/mm.

Measurement of Piezoelectric Constant and Mechanical Quality Factor

The piezoelectric constant and the mechanical quality factor of the piezoelectric element can be calculated from the resonance frequency and the antiresonant frequency measured with a commercially available impedance analyzer in accordance with a standard of Japan Electronics and Information Technology Industries Association (JEITA EM-4501). This method is hereinafter referred to as a resonance-antiresonance method.

Structure of Multilayered Piezoelectric element

A multilayered piezoelectric element according to an embodiment of the present invention will be described below.

A multilayered piezoelectric element according to an embodiment of the present invention includes a plurality of piezoelectric ceramic layers and a plurality of electrode layers alternately stacked on top of one another. The electrode layers include an internal electrode. The piezoelectric ceramic layers are formed of a piezoelectric ceramic according to an embodiment of the present invention. The whole or part of each of the piezoelectric ceramic layers between the electrode layers has remanent polarization.

Figure 2A:
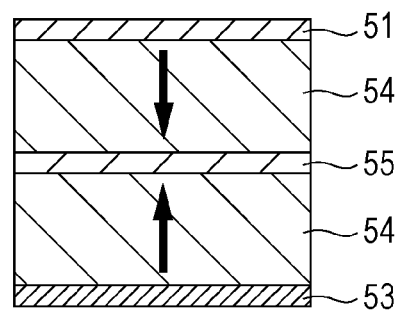
FIGS. 2A and 2B are schematic cross-sectional views of a multilayered piezoelectric element according to an embodiment of the present invention.
Figure 2B:
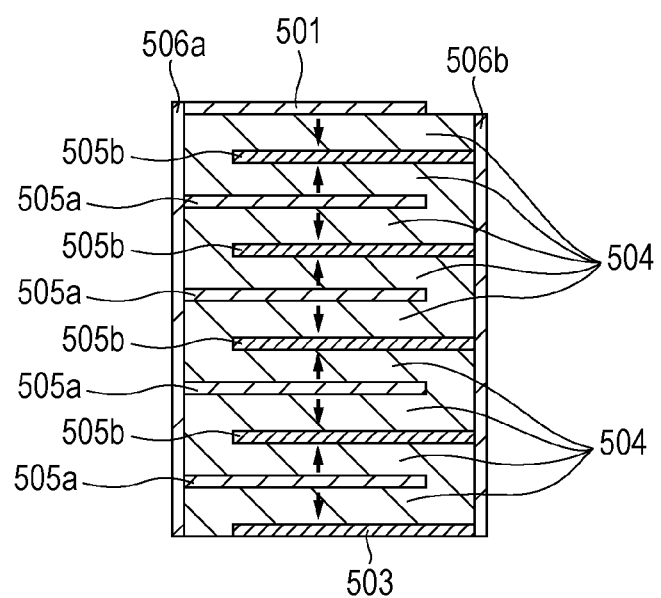

FIGS. 2A and 2B are schematic cross-sectional views of a multilayered piezoelectric element according to an embodiment of the present invention. A multilayered piezoelectric element according to an embodiment of the present invention includes piezoelectric ceramic layers 54 and electrodes alternately stacked on top of one another. The electrodes include an internal electrode 55. The piezoelectric ceramic layers 54 are composed mainly of a perovskite-type metal oxide represented by the general formula (2). The electrodes may include external electrodes, such as a first electrode 51 and a second electrode 53, in addition to the internal electrode 55. The whole or part of each of the piezoelectric ceramic layers 54 between the electrodes has remanent polarization. The arrows illustrated in the piezoelectric ceramic layers 54 schematically indicate the direction of remanent polarization of the piezoelectric ceramic layers 54. Whether or not the piezoelectric ceramic layers 54 have remanent polarization can be determined by applying an electric field between the electrodes disposed on opposite sides of the corresponding piezoelectric ceramic layer 54 and measuring the relationship between the applied electric field E and polarization P (a P-E hysteresis curve). When the whole or part of each of the piezoelectric ceramic layers 54 in the multilayered piezoelectric element has unidirectional remanent polarization (in one of two directions perpendicular to the electrodes), the multilayered piezoelectric element has a high piezoelectric strain due to the unidirectional polarization moment involved in piezoelectric actuation.

The multilayered piezoelectric element illustrated in FIG. 2A includes two piezoelectric ceramic layers 54 and one internal electrode 55 interposed therebetween, and the layered structure is disposed between the first electrode 51 and the second electrode 53. The number of piezoelectric ceramic layers and the number of internal electrodes are not particularly limited and may be increased, as illustrated in FIG. 2B. The multilayered piezoelectric element illustrated in FIG. 2B includes nine piezoelectric ceramic layers 504 and eight internal electrodes 505 (505a and 505b) alternately stacked on top of one another, and the layered structure is disposed between a first electrode 501 and a second electrode 503. The multilayered piezoelectric element further includes an external electrode 506a and an external electrode 506b for connecting the interdigital internal electrodes 505. The internal electrodes 55 and 505 and the external electrodes 506a and 506b may have a size and shape different from the size and shape of the piezoelectric ceramic layers 54 and 504 and may be composed of a plurality of portions. The whole or part of each of the piezoelectric ceramic layers 504 between the electrodes has remanent polarization.

The direction of remanent polarization in any of the piezoelectric ceramic layers can be opposite to the direction of remanent polarization in its adjacent piezoelectric ceramic layers along the stacking direction. In other words, the remanent polarization regions in the piezoelectric ceramic layers can have remanent polarization in alternate directions along the stacking direction. Remanent polarization in alternate directions along the stacking direction results in uniform expansion and contraction of the piezoelectric ceramic layers and a large piezoelectric displacement in the operation of the multilayered piezoelectric element. For example, in FIG. 2A, the direction of remanent polarization in the region of the piezoelectric ceramic layers 54 between the first electrode 51 and the internal electrode 55 is different from the direction of remanent polarization in the region between the second electrode 53 and the internal electrode 55. In a process of manufacturing the multilayered piezoelectric element, when the internal electrode 55 has zero potential, and a positive or negative electric field is applied to the first electrode 51 and the second electrode 53, the piezoelectric ceramic layers 54 on opposite sides of the internal electrode 55 have remanent polarization in opposite directions (upward and downward remanent polarization with respect to a horizontal electrode surface). Also in the piezoelectric ceramic layers 504 illustrated in FIG. 2B, the directions of remanent polarization in the piezoelectric ceramic layers 504 on opposite sides of each of the internal electrodes 505 are alternating along the stacking direction as schematically illustrated by the arrows.

Each of the internal electrodes 55 and 505, the external electrodes 506a and 506b, the first electrodes 51 and 501, and the second electrodes 53 and 503 is formed of an electrically conductive layer having a thickness in the range of approximately 5 to 2000 nm. The materials of these electrodes are not particularly limited and may be any materials that are generally used in piezoelectric elements. Examples of such materials include, but are not limited to, metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be formed of one of these materials or a mixture or alloy thereof or may be a multilayer electrode formed of two or more of the materials. These electrodes may be formed of different materials.

The internal electrodes 55 and 505 can contain Ag and Pd. The weight ratio M1/M2 of the weight M1 of Ag to the weight M2 of Pd is preferably in the range of 0.25≤M1/M2≤4.0, more preferably 0.3≤M1/M2≤3.0. A weight ratio M1/M2 of less than 0.25 is undesirable because the sintering temperatures of the internal electrodes 55 and 505 are increased. A weight ratio M1/M2 of more than 4.0 is also undesirable because the internal electrodes 55 and 505 become island-shaped and lack in-plane uniformity.

The internal electrodes 55 and 505 can contain at least one of Ni and Cu, which are inexpensive electrode materials. When the internal electrodes 55 and 505 contain at least one of Ni and Cu, the multilayered piezoelectric element can be fired in a reducing atmosphere.

As illustrated in FIG. 2B, the plurality of electrodes including the internal electrodes 505 may be connected to each other in order to synchronize the driving voltage phases. For example, the internal electrodes 505a may be connected to the first electrode 501 through the external electrode 506a. The internal electrodes 505b may be connected to the second electrode 503 through the external electrode 506b. The internal electrodes 505a and the internal electrodes 505b may be alternately disposed. The electrodes may be connected using any method. For example, an electrode or a conductor line for connection may be disposed on a side surface of the multilayered piezoelectric element. Alternatively, a through-hole passing through the piezoelectric ceramic layers 504 may be formed, and the inside of the through-hole may be coated with a conductive material to connect the electrodes.

Liquid Discharge Head

A liquid discharge head according to an embodiment of the present invention includes a liquid chamber and an orifice for discharging in communication with the liquid chamber. The liquid chamber includes a vibrating portion that includes a piezoelectric element or a multilayered piezoelectric element according to an embodiment of the present invention.

Figure 3A:
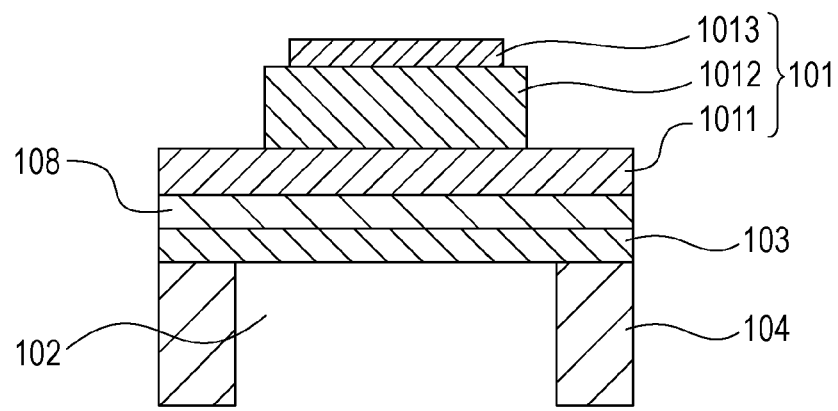
FIGS. 3A and 3B are schematic views of a liquid discharge head according to an embodiment of the present invention.
Figure 3B:
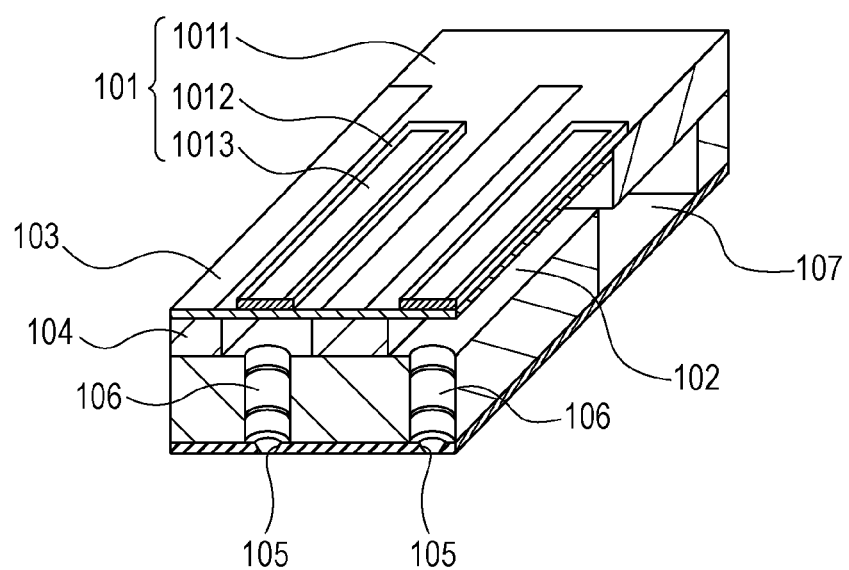

FIGS. 3A and 3B are schematic views of a liquid discharge head according to an embodiment of the present invention. As illustrated in FIGS. 3A and 3B, the liquid discharge head includes a piezoelectric element 101 according to an embodiment of the present invention. The piezoelectric element 101 includes a first electrode 1011, a piezoelectric ceramic 1012, and a second electrode 1013. As illustrated in FIG. 3B, the piezoelectric ceramic 1012 may be patterned.

FIG. 3B is a schematic view of the liquid discharge head. The liquid discharge head includes an orifice for discharging 105, an individual liquid chamber 102, a communicating hole 106 that connects the individual liquid chamber 102 to the orifice for discharging 105, a liquid chamber partition wall 104, a common liquid chamber 107, a diaphragm 103, and the piezoelectric element 101. Although the piezoelectric element 101 is rectangular in FIG. 3B, the piezoelectric element 101 may be of another shape, such as elliptical, circular, or parallelogrammic. In general, the piezoelectric ceramic 1012 has a shape similar to the shape of the individual liquid chamber 102.

The piezoelectric element 101 of the liquid discharge head will be described in detail below with reference to FIG. 3A. FIG. 3A is a cross-sectional view of FIG. 3B in the width direction of the piezoelectric element. Although the piezoelectric element 101 has a rectangular cross section in FIG. 3A, the piezoelectric element 101 may have a trapezoidal or inverted trapezoidal cross section.

In FIG. 3A, the first electrode 1011 is a lower electrode, and the second electrode 1013 is an upper electrode. The first electrode 1011 and the second electrode 1013 may be arranged differently. For example, the first electrode 1011 may be a lower electrode or an upper electrode. Likewise, the second electrode 1013 may be an upper electrode or a lower electrode. A buffer layer 108 may be disposed between the diaphragm 103 and the lower electrode. These different designations result from variations in the method for manufacturing the device, and each of the cases has the advantages of the present invention.

In the liquid discharge head, the diaphragm 103 bends upward and downward with the expansion and contraction of the piezoelectric ceramic 1012, thereby applying pressure to a liquid in the individual liquid chamber 102. This allows the liquid to be discharged from the orifice for discharging 105. A liquid discharge head according to an embodiment of the present invention can be used in printers and in the manufacture of electronic equipment.

The diaphragm 103 has a thickness in the range of 1.0 to 15 m, preferably 1.5 to 8 µm. The material of the diaphragm 103 is not particularly limited and can be Si. Si of the diaphragm 103 may be doped with boron or phosphorus. The buffer layer 108 and the first electrode 1011 on the diaphragm 103 may constitute the diaphragm. The buffer layer 108 has a thickness in the range of 5 to 300 nm, preferably 10 to 200 nm. The orifice for discharging 105 has an equivalent circular diameter in the range of 5 to 40 µm. The orifice for discharging 105 may be circular, star-shaped, square, or triangular.

Liquid Discharge Apparatus

A liquid discharge apparatus according to an embodiment of the present invention will be described below. A liquid discharge apparatus according to an embodiment of the present invention includes a stage configured to receive an object and the liquid discharge head described above.

Figure 4:
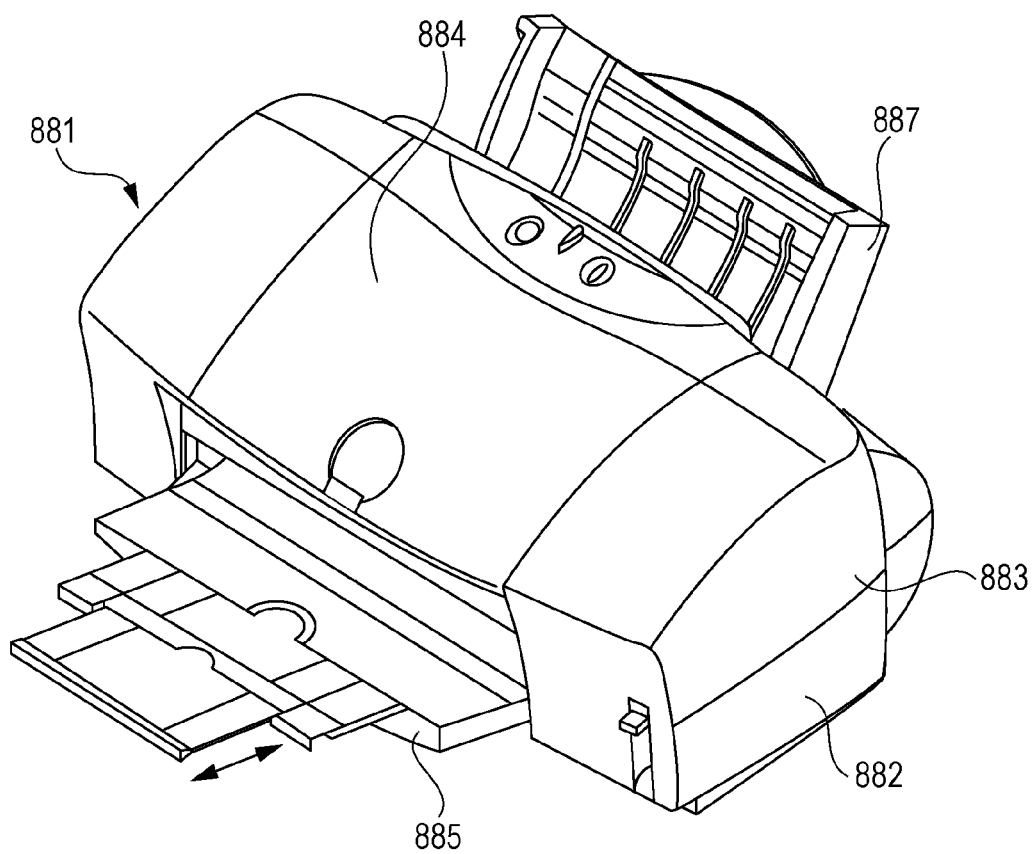
FIG. 4 is a schematic view of a liquid discharge apparatus according to an embodiment of the present invention.
Figure 5:
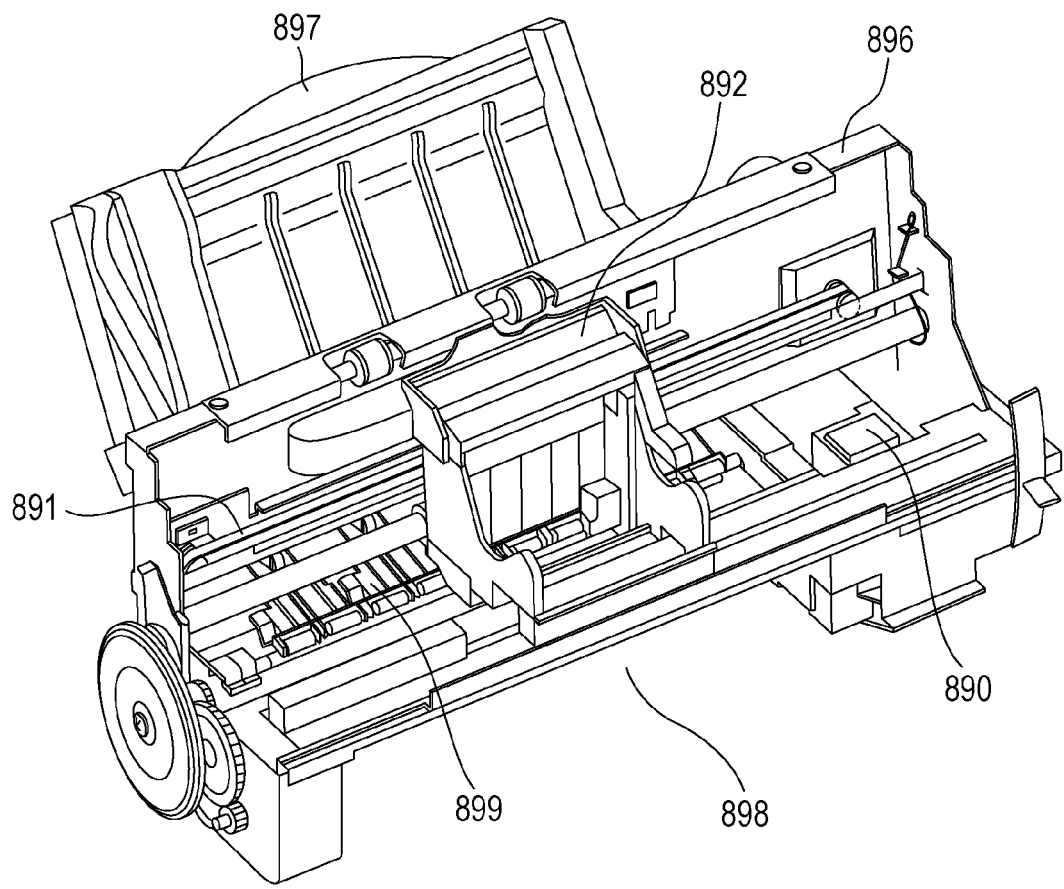
FIG. 5 is a schematic view of a liquid discharge apparatus according to an embodiment of the present invention.

The liquid discharge apparatus may be an ink jet recording apparatus, as illustrated in FIGS. 4 and 5. FIG. 5 illustrates the liquid discharge apparatus (ink jet recording apparatus) 881 illustrated in FIG. 4 without exteriors 882 to 885 and 887. The ink jet recording apparatus 881 includes an automatic feeder 897 for automatically feeding a recording paper sheet as an object to a main body 896 of the apparatus. The ink jet recording apparatus 881 further includes a conveying unit 899 serving as a stage configured to receive an object, which conveys a recording paper sheet from the automatic feeder 897 to a predetermined recording position and from the recording position to an outlet 898, a recording unit 891 for recording to the recording paper sheet at the recording position, and a recovering unit 890 for recovering the recording unit 891. The recording unit 891 includes a carriage 892 for housing a liquid discharge head according to an embodiment of the present invention. The carriage 892 travels along a rail.

The carriage 892 travels along the rail in response to electric signals sent from a computer. A piezoelectric ceramic is deformed in response to the application of a driving voltage to electrodes disposed on opposite sides of the piezoelectric ceramic. The displacement of the piezoelectric ceramic causes the individual liquid chamber 102 to be pressed via the diaphragm 103 illustrated in FIG. 3B and thereby causes an ink to be discharged through the orifice for discharging 105. Thus, characters are printed.

A liquid discharge apparatus according to an embodiment of the present invention can uniformly discharge a liquid at a high speed and can be decreased in size.

In addition to the printer described above, a liquid discharge apparatus according to an embodiment of the present invention can be used in other ink jet recording apparatuses, such as facsimile machines, multifunction devices, and copiers, and industrial liquid discharge apparatuses.

Furthermore, users can select a desired object for each application. The liquid discharge head may move relative to an object disposed on a stage configured to receive the object.

Ultrasonic Motor

An ultrasonic motor according to an embodiment of the present invention will be described below. An ultrasonic motor according to an embodiment of the present invention includes a vibrating member and a moving body in contact with the vibrating member. The vibrating member includes a piezoelectric element or a multilayered piezoelectric element according to an embodiment of the present invention.

Figure 6A:
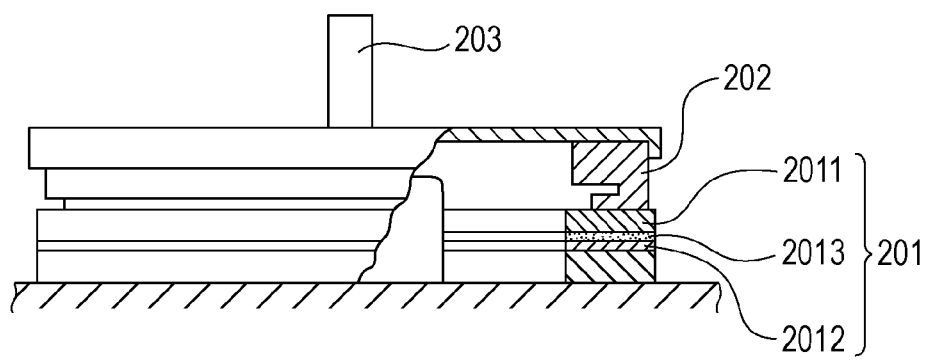
FIGS. 6A and 6B are schematic views of an ultrasonic motor according to an embodiment of the present invention.
Figure 6B:
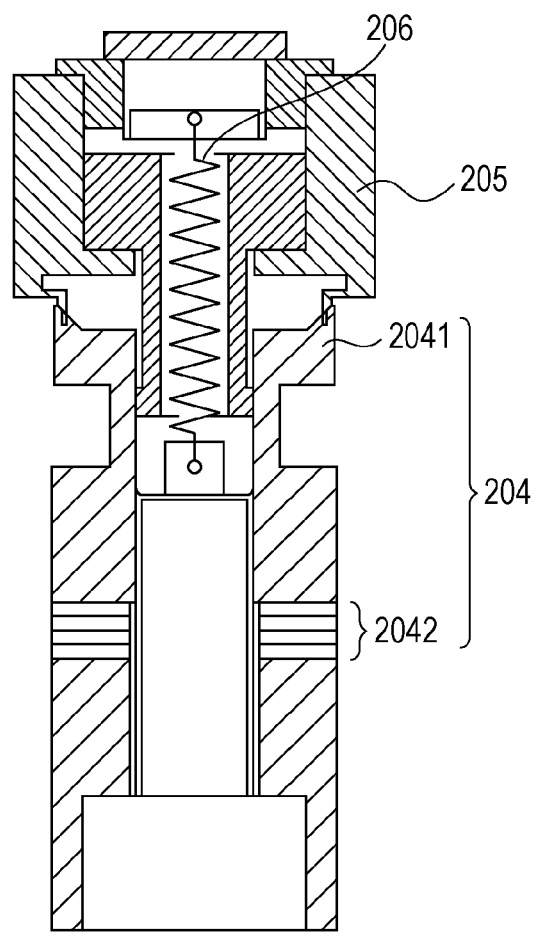

FIGS. 6A and 6B are schematic views of an ultrasonic motor according to an embodiment of the present invention. The ultrasonic motor illustrated in FIG. 6A includes a single plate of a piezoelectric element according to an embodiment of the present invention. The ultrasonic motor includes an oscillator 201, a rotor 202 pressed against a sliding surface of the oscillator 201 by the action of a pressure spring (not shown), and an output shaft 203, which is formed integrally with the rotor 202. The oscillator 201 includes a metal elastic ring 2011, a piezoelectric element 2012 according to an embodiment of the present invention, and an organic adhesive 2013 (such as epoxy or cyanoacrylate) that bonds the piezoelectric element 2012 to the elastic ring 2011. Although not shown in the figure, the piezoelectric element 2012 includes a piezoelectric ceramic between a first electrode and a second electrode.

In response to the application of two-phase alternating voltages that differ by an odd number times $\pi/2$ in phase to a piezoelectric element according to an embodiment of the present invention, a flexural traveling wave occurs in the oscillator 201, and points on the sliding surface of the oscillator 201 go through elliptical motion. The rotor 202 pressed against the sliding surface of the oscillator 201 receives friction force from the oscillator 201 and rotates in a direction opposite to the direction of the flexural traveling wave. A body to be driven (not shown) joined to the output shaft 203 is driven by the rotational force of the rotor 202.

In response to the application of a voltage to a piezoelectric ceramic, the piezoelectric ceramic expands and contracts due to the transverse piezoelectric effect. An elastic body, such as a metal body, joined to the piezoelectric element is bent as a result of expansion and contraction of the piezoelectric ceramic. The ultrasonic motor described herein utilizes this principle.

FIG. 6B illustrates an ultrasonic motor that includes a multilayered piezoelectric element. An oscillator 204 includes a multilayered piezoelectric element 2042 in a tubular metal elastic body 2041. The multilayered piezoelectric element 2042 includes a plurality of layered piezoelectric ceramics (not shown) and includes a first electrode and a second electrode on the outer surfaces of the layered piezoelectric ceramics and internal electrodes within the layered piezoelectric ceramics. The metal elastic body 2041 is fastened with a bolt to hold the multilayered piezoelectric element 2042, thereby constituting the oscillator 204.

In response to the application of alternating voltages of different phases to the multilayered piezoelectric element 2042, the oscillator 204 causes two oscillations perpendicular to each other. The two oscillations are synthesized to form a circular oscillation for driving a leading edge portion of the oscillator 204. The oscillator 204 has an annular groove at its upper portion. The annular groove increases the oscillatory displacement for driving.

A rotor 205 is pressed against the oscillator 204 by the action of a pressure spring 206 and receives friction force for driving. The rotor 205 is rotatably supported by a bearing.

Optical Apparatus

An optical apparatus according to an embodiment of the present invention will be described below. An optical apparatus according to an embodiment of the present invention includes a drive unit that includes the ultrasonic motor described above.

Figure 7A:
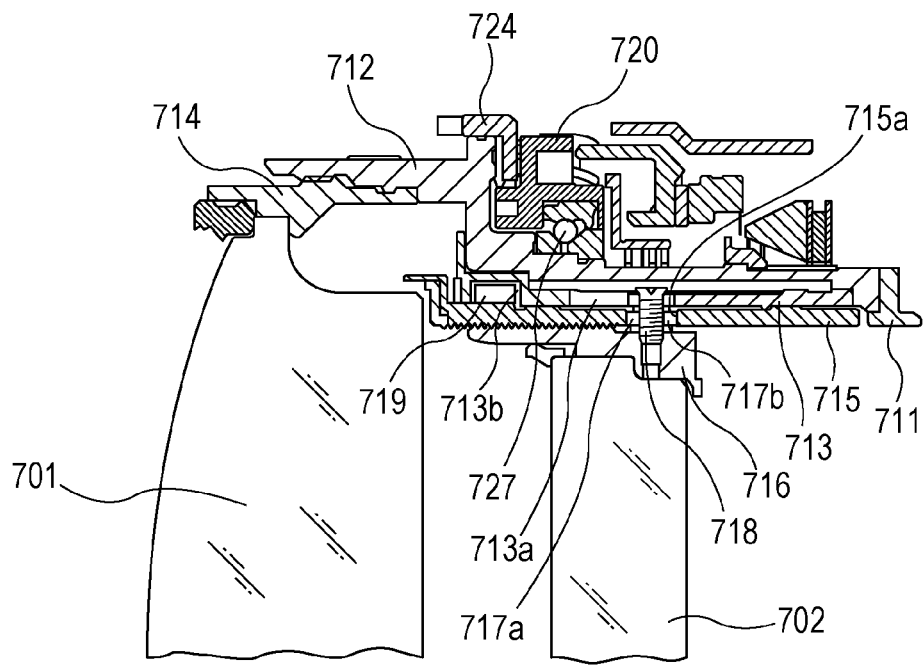
FIGS. 7A and 7B are schematic views of an optical apparatus according to an embodiment of the present invention.
Figure 7B:
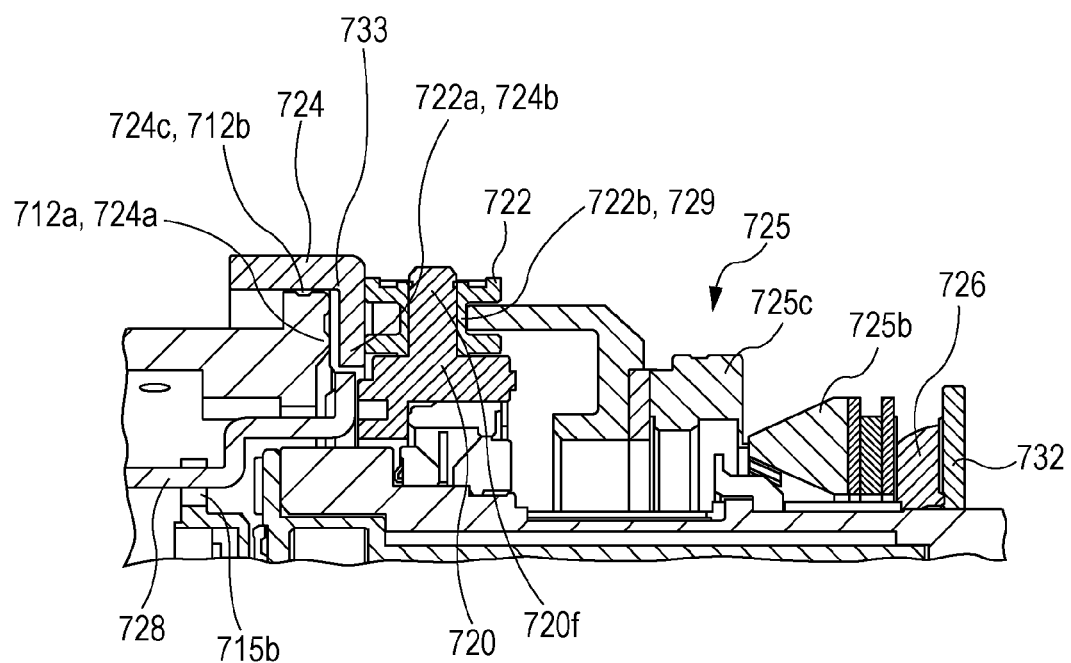

FIGS. 7A and 7B are cross-sectional views of an interchangeable lens barrel of a single-lens reflex camera, which is an image pickup apparatus according to an embodiment of the present invention. FIG. 8 is an exploded perspective view of an interchangeable lens barrel of a single-lens reflex camera, which is an image pickup apparatus according to an embodiment of the present invention. A fixed barrel 712, a linear guide barrel 713, and a front lens group barrel 714 are fixed to a removable mount 711 of the camera. These components are fixed members of the interchangeable lens barrel.

The linear guide barrel 713 has a linear guide groove 713a for a focus lens 702 in the optical axis direction. The focus lens 702 is supported by a rear lens group barrel 716. Cam rollers 717a and 717b protruding outwardly in the radial direction are fixed to the rear lens group barrel 716 with a screw 718. The cam roller 717a fits in the linear guide groove 713a.

A cam ring 715 rotatably fits in the internal circumference of the linear guide barrel 713. A roller 719 fixed to the cam ring 715 is caught in an annular groove 713b of the linear guide barrel 713, thereby restricting the relative displacement of the linear guide barrel 713 and the cam ring 715 in the optical axis direction. The cam ring 715 has a cam groove 715a for the focus lens 702. The cam roller 717b also fits in the cam groove 715a.

A rotation transmitting ring 720 is rotatably held by a ball race 727 at a fixed position on the periphery of the fixed barrel 712. A driven roller 722 is rotatably held by a shaft 720f extending radially from the rotation transmitting ring 720. A large-diameter portion 722a of the driven roller 722 is in contact with a mount side end face 724b of a manual focus ring 724. A small-diameter portion 722b of the driven roller 722 is in contact with a joint member 729. Six driven rollers 722 are disposed at regular intervals on the periphery of the rotation transmitting ring 720. Each of the driven rollers 722 satisfies the structural relationship described above.

A low-friction sheet (washer member) 733 is disposed on the inside of the manual focus ring 724. The low-friction sheet 733 is disposed between a mount side end face 712a of the fixed barrel 712 and a front end face 724a of the manual focus ring 724. The low-friction sheet 733 has a circular outer surface having a diameter that fits to the bore diameter 724c of the manual focus ring 724. The bore diameter 724c of the manual focus ring 724 fits to the diameter of an outer portion 712b of the fixed barrel 712. The low-friction sheet 733 can reduce friction in the rotating ring mechanism in which the manual focus ring 724 rotates about the optical axis relative to the fixed barrel 712.

The large-diameter portion 722a of the driven roller 722 is pressed against the mount side end face 724b of the manual focus ring 724 because a wave washer 726 presses an ultrasonic motor 725 forward to the front of the lens. Likewise, because the wave washer 726 presses the ultrasonic motor 725 forward to the front of the lens, the small-diameter portion 722b of the driven roller 722 is appropriately pressed against the joint member 729. The wave washer 726 is prevented from moving toward the mount by a washer 732 bayonet coupled to the fixed barrel 712. The spring force (impelling force) of the wave washer 726 is transmitted to the ultrasonic motor 725 and the driven roller 722 and also presses the manual focus ring 724 against the mount side end face 712a of the fixed barrel 712. In other words, the manual focus ring 724 is pressed against the mount side end face 712a of the fixed barrel 712 via the low-friction sheet 733.

Thus, when the ultrasonic motor 725 is rotated by a control unit (not shown) relative to the fixed barrel 712, the driven roller 722 rotates about the shaft 720f because the joint member 729 is in frictional contact with the small-diameter portion 722b of the driven roller 722. The rotation of the driven roller 722 about the shaft 720f causes the rotation of the rotation transmitting ring 720 about the optical axis (automatic focusing).

When a manual input portion (not shown) provides the manual focus ring 724 with rotational force about the optical axis, the driven roller 722 is rotated about the shaft 720f by friction force, because the mount side end face 724b of the manual focus ring 724 is pressed against the large-diameter portion 722a of the driven roller 722. The rotation of the large-diameter portion 722a of the driven roller 722 about the shaft 720f causes the rotation of the rotation transmitting ring 720 about the optical axis. However, the ultrasonic motor 725 is not rotated due to the friction force between a rotor 725c and a stator 725b (manual focusing).

The rotation transmitting ring 720 is provided with two focus keys 728 facing each other. These focus keys 728 fit into notches 715b at a leading edge of the cam ring 715. Thus, in response to automatic focusing or manual focusing, the rotation transmitting ring 720 is rotated about the optical axis, and the rotational force is transmitted to the cam ring 715 via the focus keys 728. When the cam ring 715 is rotated about the optical axis, the cam roller 717b moves the cam roller 717a and the rear lens group barrel 716 restricted by the linear guide groove 713a forward or backward along the cam groove 715a of the cam ring 715. This drives the focus lens 702 and allows focusing.

Although an optical apparatus according to an embodiment of the present invention has been described with reference to an interchangeable lens barrel of a single-lens reflex camera, the present invention can also be applied to optical apparatuses that include an ultrasonic motor in a drive unit, for example, cameras, such as compact cameras and electronic still cameras.

Vibratory Apparatus and Dust Removing Devices

Vibratory apparatuses for conveying or removing particles, powders, and liquids are widely used in electronic equipment. As an example of a vibratory apparatus according to an embodiment of the present invention, a dust removing device that includes a piezoelectric element according to an embodiment of the present invention will be described below.

A dust removing device according to an embodiment of the present invention includes a vibrating member that includes a piezoelectric element or a multilayered piezoelectric element according to an embodiment of the present invention on a diaphragm.

Figure 9A:
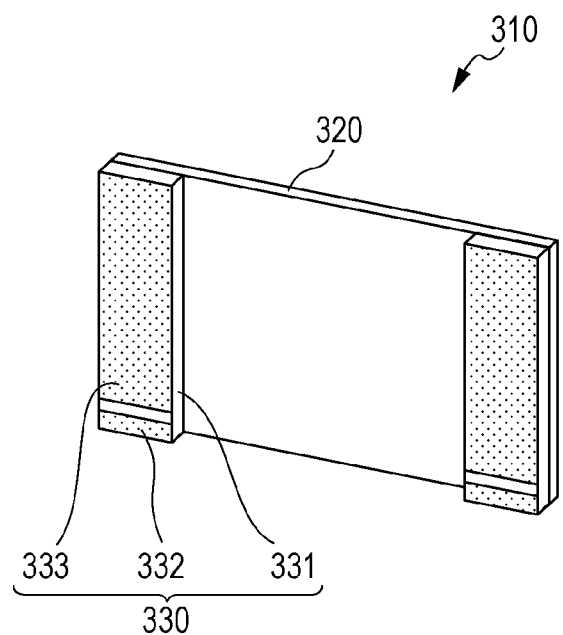
FIGS. 9A and 9B are schematic views of a dust removing device according to an embodiment of the present invention.
Figure 9B:
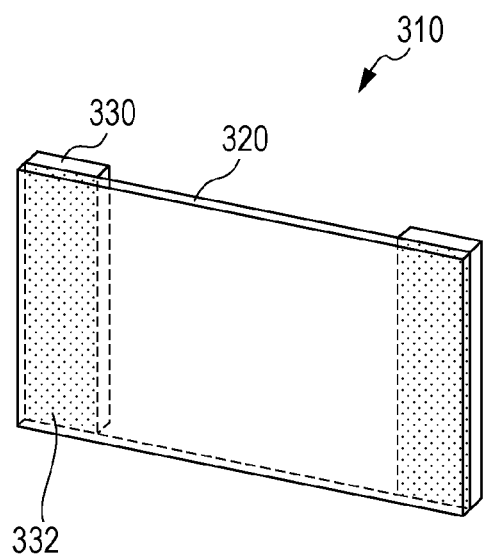

FIGS. 9A and 9B are schematic views of a dust removing device 310 according to an embodiment of the present invention. The dust removing device 310 includes a plate of a piezoelectric element 330 and a diaphragm 320. The piezoelectric element 330 may be a multilayered piezoelectric element according to an embodiment of the present invention. The diaphragm 320 may be made of any material. When the dust removing device 310 is used in optical devices, the diaphragm 320 may be made of a light-transmitting material or a light-reflective material.

Figure 10A:
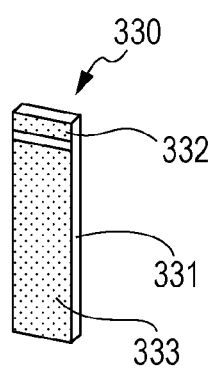
FIGS. 10A to 10C are schematic views of a piezoelectric element of a dust removing device according to an embodiment of the present invention.
Figure 10B:
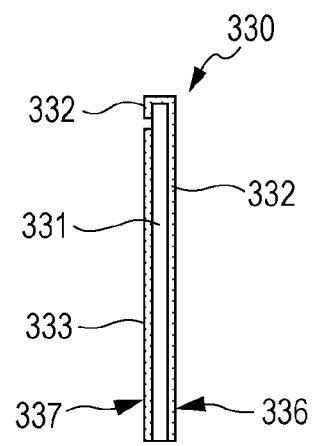
Figure 10C:
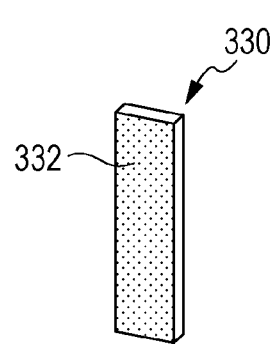

FIGS. 10A to 10C are schematic views of the piezoelectric element 330 illustrated in FIGS. 9A and 9B. FIGS. 10A and 10C illustrate the front and back sides of the piezoelectric element 330. FIG. 10B is a side view of the piezoelectric element 330. As illustrated in FIGS. 9A and 9B and FIGS. 10A to 10C, the piezoelectric element 330 includes a piezoelectric ceramic 331, a first electrode 332, and a second electrode 333. The first electrode 332 and the second electrode 333 are disposed on opposite sides of the piezoelectric ceramic 331. As in FIGS. 9A and 9B, the piezoelectric element 330 may be a multilayered piezoelectric element according to an embodiment of the present invention. In this case, the piezoelectric ceramic 331 includes piezoelectric ceramic layers and internal electrodes alternately stacked on top of one another. The internal electrodes are alternately connected to the first electrode 332 and the second electrode 333, thereby allowing the piezoelectric ceramic layers to alternately have a driving waveform of a different phase. As illustrated in FIG. 10C, a surface of the piezoelectric element 330 on which the first electrode 332 is disposed is referred to as a first electrode surface 336. As illustrated in FIG. 10A, a surface of the piezoelectric element 330 on which the second electrode 333 is disposed is referred to as a second electrode surface 337.

The term "electrode surface", as used herein, refers to a surface of a piezoelectric element on which an electrode is disposed. For example, as illustrated in FIG. 10B, the first electrode 332 may round a corner and extends to the second electrode surface 337.

As illustrated in FIGS. 9A and 9B, the first electrode surface 336 of the piezoelectric element 330 is bonded to the diaphragm 320. Actuation of the piezoelectric element 330 produces a stress between the piezoelectric element 330 and the diaphragm 320, thereby causing out-of-plane oscillations on the diaphragm 320. The dust removing device 310 removes foreign substances, such as dust, on the diaphragm 320 by the action of out-of-plane oscillations. The term "out-of-plane oscillations", as used herein, refers to elastic oscillations that cause displacements of a diaphragm in the optical axis direction or the diaphragm thickness direction.

Figure 11A:
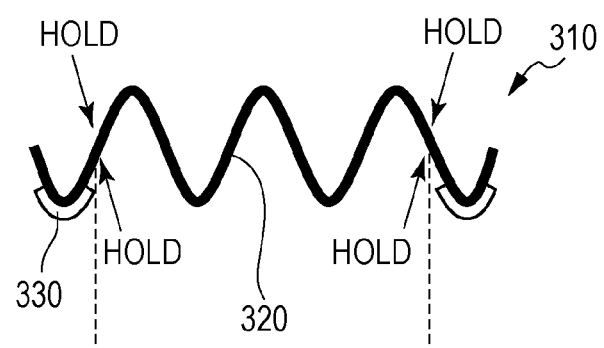
FIGS. 11A and 11B are schematic views illustrating the vibration principle of a dust removing device according to an embodiment of the present invention.
Figure 11B:
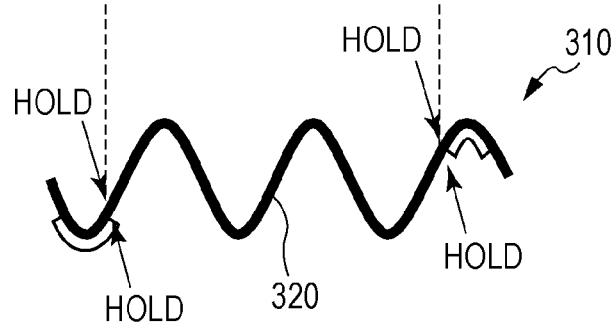

FIGS. 11A and 11B are schematic views illustrating the vibration principle of the dust removing device 310. In FIG. 11A, in-phase alternating voltages are applied to a left-and-right pair of the piezoelectric elements 330 to cause out-of-plane oscillations of the diaphragm 320. The direction of polarization of the piezoelectric ceramic constituting the left-and-right pair of the piezoelectric elements 330 is the same as the thickness direction of the piezoelectric elements 330. The dust removing device 310 is driven in a seventh oscillation mode. In FIG. 11B, an anti-phase alternating voltage is applied to a left-and-right pair of the piezoelectric elements 330 to cause out-of-plane oscillations of the diaphragm 320. The dust removing device 310 is driven in a sixth oscillation mode. The dust removing device 310 can employ at least two oscillation modes to effectively remove dust on the surface of the diaphragm.

Image Pickup Apparatus

Figure 12:
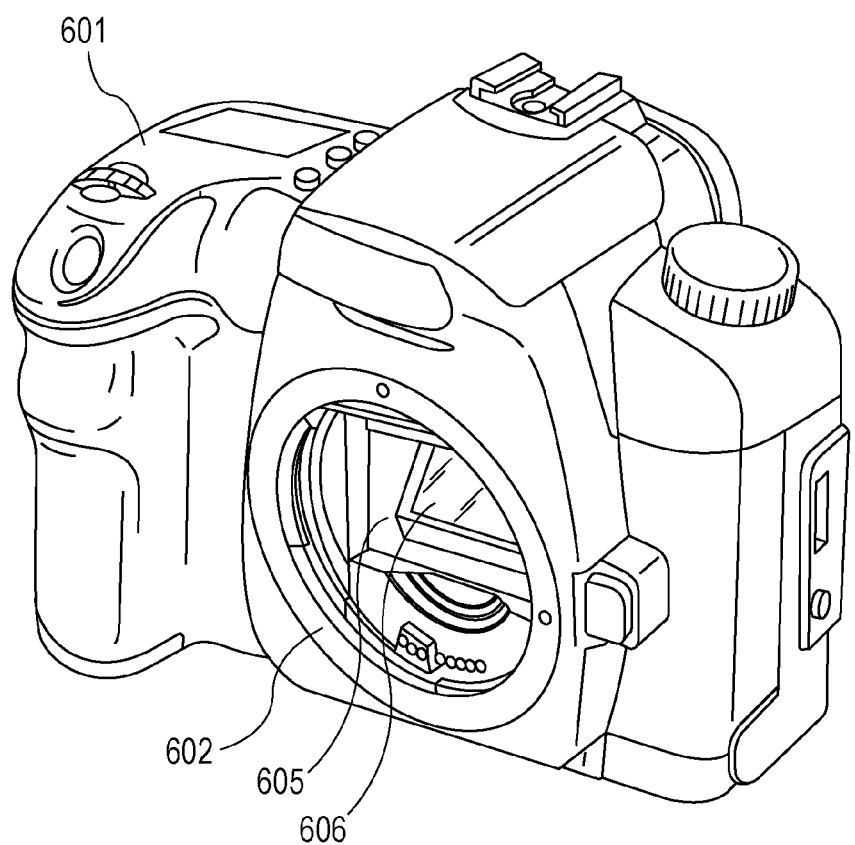
FIG. 12 is a schematic view of an image pickup apparatus according to an embodiment of the present invention.
Figure 13:
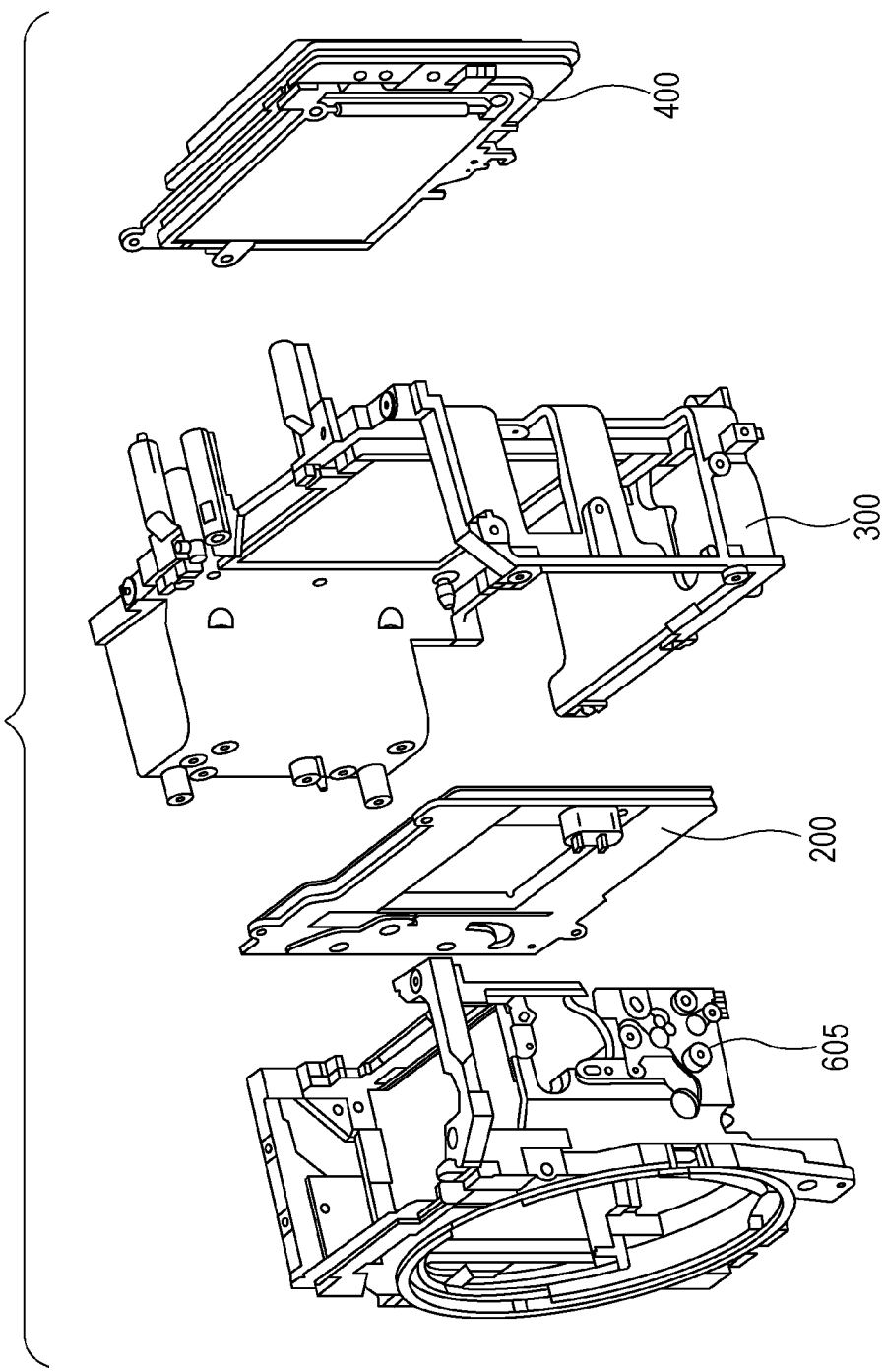
FIG. 13 is a schematic view of an image pickup apparatus according to an embodiment of the present invention.

An image pickup apparatus according to an embodiment of the present invention will be described below. An image pickup apparatus according to an embodiment of the present invention includes a dust removing device according to an embodiment of the present invention and an image pickup element unit, wherein the dust removing device includes a vibratory apparatus, which includes a diaphragm on the light-receiving surface of the image pickup element unit. FIGS. 12 and 13 illustrate a digital single-lens reflex camera, which is an image pickup apparatus according to an embodiment of the present invention.

FIG. 12 is a front perspective view of a main body 601 of the camera viewed from the object side. A taking lens unit has been removed. FIG. 13 is an exploded perspective view of the inside of the camera, illustrating surrounding structures of a dust removing device according to an embodiment of the present invention and an image pickup unit 400.

The main body 601 of the camera includes a mirror box 605 to which an image light beam passing through a taking lens is directed. The mirror box 605 includes a main mirror (quick return mirror) 606. The main mirror 606 can make an angle of 45 degrees with the optical axis to direct an image light beam to a penta roof mirror (not shown) or may avoid the image light beam in order to direct the image light beam to an image pickup element (not shown).

The mirror box 605 and a shutter unit 200 are disposed in front of a main body chassis 300 of the main body 601 of the camera in this order from the object side. The image pickup unit 400 is disposed on the photographer side of the main body chassis 300. The image pickup unit 400 is installed such that an image pickup surface of the image pickup element is disposed at a predetermined distance from and parallel to the surface of a mount 602 to which a taking lens unit is to be attached.

Although the digital single-lens reflex camera has been described as an image pickup apparatus according to an embodiment of the present invention, the image pickup apparatus may be an interchangeable-lens camera, such as a mirrorless digital interchangeable-lens camera without the mirror box 605. Among various image pickup apparatuses and electrical and electronic equipment that include image pickup apparatuses, such as interchangeable-lens video cameras, copiers, facsimile machines, and scanners, an image pickup apparatus according to an embodiment of the present invention can particularly be applied to devices that require the removal of dust deposited on a surface of an optical part.

Electronic Equipment

Electronic equipment according to an embodiment of the present invention will be described below. The electronic equipment includes a piezoelectric acoustic component that includes a piezoelectric element or a multilayered piezoelectric element according to an embodiment of the present invention. The piezoelectric acoustic component may be a loudspeaker, a buzzer, a microphone, or a surface acoustic wave (SAW) device.

Figure 14:
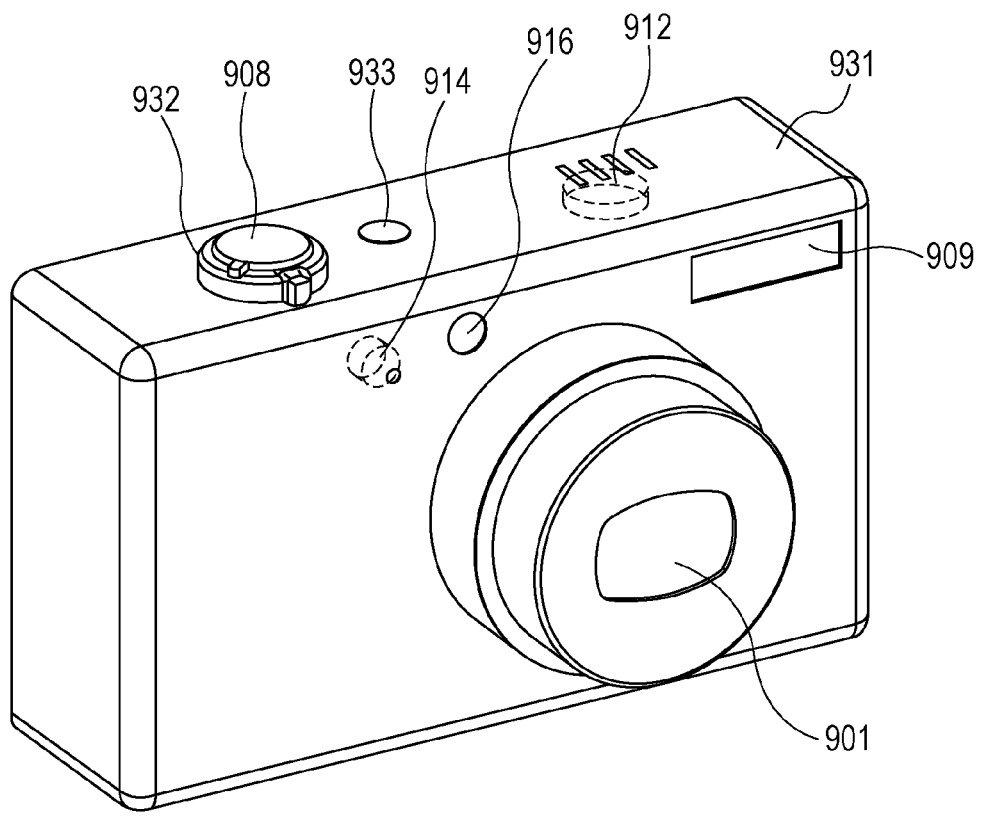
FIG. 14 is a schematic view of electronic equipment according to an embodiment of the present invention.

FIG. 14 is a front perspective view of a main body 931 of a digital camera, which is electronic equipment according to an embodiment of the present invention. An optical device 901, a microphone 914, an electronic flash unit 909, and a fill light unit 916 are disposed on the front surface of the main body 931. The microphone 914 is disposed within the main body 931 and is indicated by a broken line. An opening for catching external sound is disposed in front of the microphone 914.

A power switch 933, a loudspeaker 912, a zoom lever 932, and a release button 908 for focusing are disposed on the top face of the main body 931. The loudspeaker 912 is disposed within the main body 931 and is indicated by a broken line. An opening for transmitting sound to the outside is disposed in front of the loudspeaker 912.

The piezoelectric acoustic component may be used in at least one of the microphone 914, the loudspeaker 912, and a surface acoustic wave device.

Although the digital camera has been described as electronic equipment according to an embodiment of the present invention, the electronic equipment may also be applied to electronic equipment that includes a piezoelectric acoustic component, such as audio-reproducing devices, audio-recording devices, mobile phones, and information terminals.

As described above, a piezoelectric element and a multilayered piezoelectric element according to an embodiment of the present invention are suitable for liquid discharge heads, liquid discharge apparatuses, ultrasonic motors, optical apparatuses, vibratory apparatuses, dust removing devices, image pickup apparatuses, and electronic equipment.

A liquid discharge head that includes a lead-free piezoelectric element according to an embodiment of the present invention can have a nozzle density and discharge capacity equal to or higher than those of liquid discharge heads that include a lead-containing piezoelectric element.

A liquid discharge apparatus that includes a lead-free piezoelectric element according to an embodiment of the present invention can have a discharge velocity and discharge accuracy equal to or higher than those of liquid discharge apparatuses that include a lead-containing piezoelectric element.

An ultrasonic motor that includes a lead-free piezoelectric element according to an embodiment of the present invention can have driving force and durability equal to or higher than those of ultrasonic motors that include a lead-containing piezoelectric element.

An optical apparatus that includes a lead-free piezoelectric element according to an embodiment of the present invention can have durability and operation accuracy equal to or higher than those of optical apparatuses that include a lead-containing piezoelectric element.

A vibratory apparatus that includes a lead-free piezoelectric element according to an embodiment of the present invention can have vibration ability and durability equal to or higher than those of vibratory apparatuses that include a lead-containing piezoelectric element.

A dust removing device that includes a lead-free piezoelectric element according to an embodiment of the present invention can have dust removal efficiency equal to or higher than that of dust removing devices that include a lead-containing piezoelectric element.

An image pickup apparatus that includes a lead-free piezoelectric element according to an embodiment of the present invention can have a dust removal function equal to or higher than that of image pickup apparatuses that include a lead-containing piezoelectric element.

Electronic equipment that includes a piezoelectric acoustic component that includes a lead-free piezoelectric element according to an embodiment of the present invention can have sound production ability equal to or higher than that of electronic equipment that includes a lead-containing piezoelectric element.

A piezoelectric element and multilayered piezoelectric element according to an embodiment of the present invention can be suitably used in piezoelectric actuators that may be exposed to a high-temperature atmosphere of 85° C. or less.

EXAMPLES

Although the present invention will be further described with the following examples, the present invention should not be limited to these examples.

A ceramic powder according to an example of the present invention was produced as described below. A piezoelectric ceramic and a piezoelectric element were also produced from the ceramic powder.

Ceramic Powder According to Example of Present Invention

Example 1

A raw material was weighed as described below. The raw material had a composition represented by the general formula $(Ba_{1-x}Ca_x)_\alpha(Ti_{1-y-z}Zr_yMn_z)O_3$ in which $x=0.187$, $y=0.059$, $z=0.010$, and $\alpha=0.9965$:

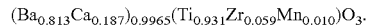

$(Ba_{0.813}Ca_{0.187})_{0.9965}(Ti_{0.931}Zr_{0.059}Mn_{0.010})O_3.$

A barium carbonate ($BaCO_3$) powder (average particle size: 600 nm, purity: 99.9% or more) was prepared as a Ba raw material. A calcium carbonate ($CaCO_3$) powder (average particle size: 1000 nm, purity: 99.9% or more) was prepared as a Ca raw material. A titanium oxide ($TiO_2$) powder (average particle size: 50 nm, purity: 99.9% or more) was prepared as a Ti raw material. A zirconium oxide ($ZrO_2$) powder (average particle size: 100 nm, purity: 99.9% or more) was prepared as a Zr raw material. A trimanganese tetroxide ($Mn_3O_4$) powder (average particle size: 1300 nm, purity: 99.5% or more) was prepared as a Mn raw material. These powders were weighed such that Ba, Ca, Ti, Zr, and Mn satisfied the composition

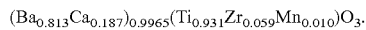

Table 1 shows the mole ratio of the raw materials. Barium carbonate or titanium oxide was used to adjust α, which represents the mole ratio of the A site to the B site. These weighed powders were dry blended in a ball mill using alumina balls for 24 hours.

The Mg, Fe, Al, and Sr contents of the mixed powder measured by ICP spectroscopy were 0.0008, 0.0010, 0.0006, and 0.0001 parts by weight, respectively, per 100 parts by weight of the mixed powder.

Firing

The mixed powder in a platinum crucible was heated in an electric furnace from room temperature to 1150° C. over 5 hours and was held at 1150° C. for 10 hours to form a ceramic powder.

Single Perovskite Ceramic Powder, $c_1/a_1$, Half-Value Width

Part of the ceramic powder was evenly spread over a glass plate and was subjected to X-ray powder diffraction measurement.

The X-ray powder diffraction measurement was performed with XRD (manufactured by Bruker AXS K.K.: D8 ADVANCE) using a 2δ-θ method. The X-ray radiation source was a Cu-Kα ray. The 2θ measurement range was 10 to 80 degrees. The scan speed was 0.50 degrees/minute. The sampling interval was 0.02 degrees. The spot diameter of incident light was 50 μm.

Figure 15A:
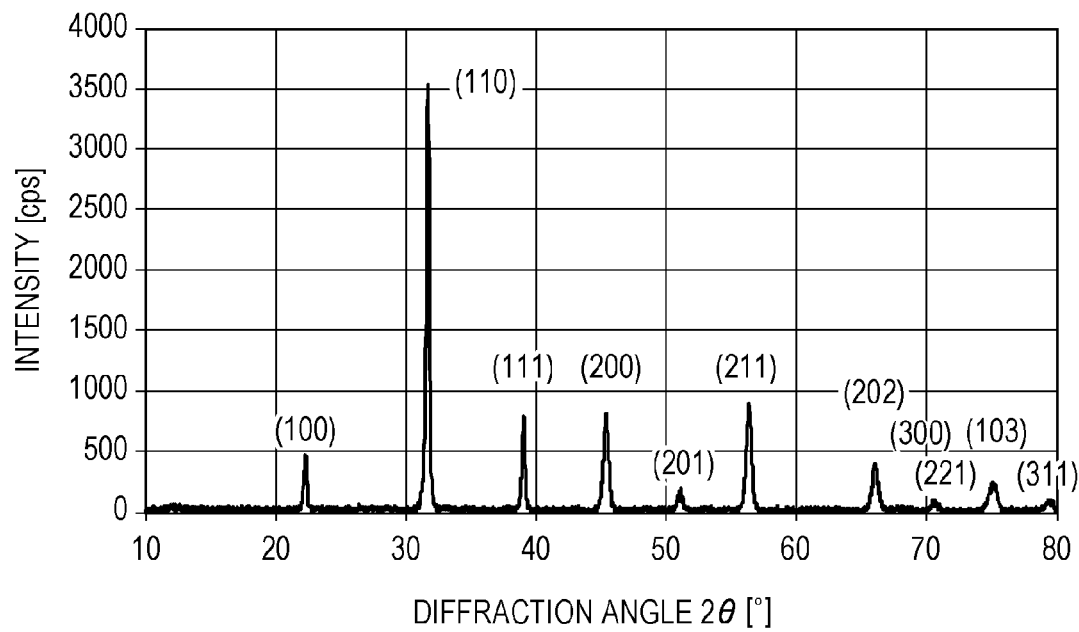
FIGS. 15A and 15B are X-ray diffraction patterns of a ceramic powder according to Example 1 of the present invention.
Figure 15B:
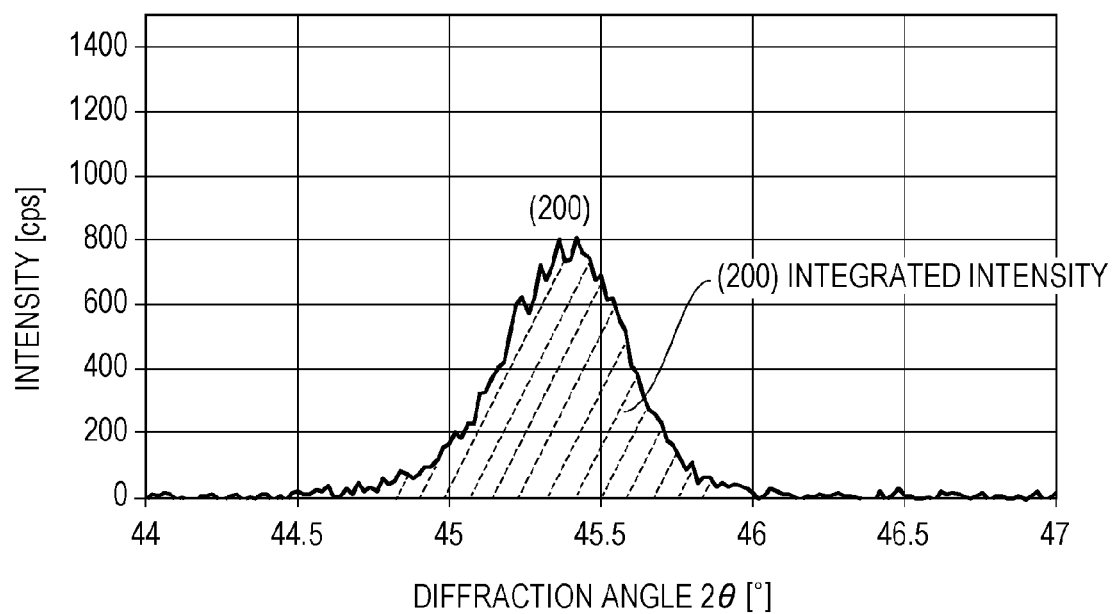

FIGS. 15A and 15B show the resulting peak patterns (X-ray diffraction patterns). FIG. 15B is an enlarged view of FIG. 15A in the range of 44 degrees≤2θ≤47 degrees. A crystal structure analysis showed that the ceramic powder according to the present example had a primary phase having a tetragonal perovskite structure. The maximum integrated intensity $I_m$ of diffraction peaks other than the diffraction peak(s) of the perovskite-type crystal phase and the integrated intensity $I_{200}$ for (200) of the primary phase satisfied $I_m \approx 0$ and $I_m/I_{200} < 0.01$. The perovskite-type crystal phase that formed the primary phase had $c_1/a_1$ of 1.004, and the half-value width of a (111) diffraction peak was 0.19 degrees.

Average Equivalent Circular Diameter of Ceramic Powder

Part of the ceramic powder was dispersed in ethanol, and a few drops of the dispersion were dropped on a sample stage. After drying the dispersion, the average equivalent circular diameter was measured with an electron microscope. The average equivalent circular diameter was 210 nm.

Measurement of Specific Surface Area of Ceramic Powder by BET Method

Part of the ceramic powder was used to measure the specific surface area by a BET method. The specific surface area was 6.1 m²/g.

Composition Analysis and Impurity Analysis of Ceramic Powder

A metal mold having a diameter of 30 mm was charged with part of the ceramic powder. The ceramic powder layer had a thickness of 2.0 mm. The ceramic powder was subjected to cold isostatic pressing at 200 MPa to form a discoidal green compact. The metal mold had a surface roughness of 100 nm or less. The composition of the ceramic powder was measured on a surface of the discoidal green compact by X-ray fluorescence spectroscopy.

The result showed that the ceramic powder according to the present example was composed mainly of a metal oxide represented by the chemical formula $(Ba_{0.813}Ca_{0.187})_{0.9965}$ $(Ti_{0.931}Zr_{0.059}Mn_{0.010})O_3$. The Mg, Fe, Al, and Sr contents were 0.0008, 0.0010, 0.0006, and 0.0001 parts by weight, respectively, per 100 parts by weight of the main component.

Mg, Sr, and Fe components were derived from the raw materials. An Al component resulted from friction between the alumina balls and the raw material powders in the ball mill. With respect to the other metal components, the weighed composition was substantially identical to the composition after sintering. Elements other than Ba, Ca, Ti, Zr, Mn, Mg, Fe, Al, and Sr were not detected.

Crystal Grains of Piezoelectric Ceramic

In order to granulate the ceramic powder, 3 parts by weight of a PVA binder per 100 parts by weight of the ceramic powder was deposited on the surface of the ceramic powder using a spray dryer. The resulting granulated powder was charged in a mold and was pressed at 200 MPa with a pressing machine to form a discoidal compact. A non-magnesium mold release agent had been applied to the surface of the mold.

In a variable atmosphere electric furnace, the compact was heated to 400° C. in the ambient atmosphere and was held at a maximum temperature of 1310° C. for 5 hours. The compact was then left to cool. A discoidal sintered body (polycrystalline ceramic) was formed through these steps. This sintered body was used as a piezoelectric ceramic for a piezoelectric element according to an example of the present invention.

The average equivalent circular diameter and relative density of the crystal grains of the piezoelectric ceramic were determined. The average equivalent circular diameter was 7.0 μm, and the relative density was 98%. The crystal grains were observed mainly using a polarizing microscope. The grain size of small crystal grains was determined with a scanning electron microscope (SEM). The average equivalent circular diameter was calculated by processing an observed image. The relative density was measured in accordance with Archimedes' principle. A polishing process described below did not significantly change the average equivalent circular diameter. Table 3 shows some measured values with respect to the piezoelectric ceramic. Ceramic powders used in the production of piezoelectric ceramics and piezoelectric elements are listed in the leftmost column of Table 3.

Crystal Structure of Piezoelectric Ceramic

The piezoelectric ceramic was polished to a thickness of 0.5 mm, and the crystal structure of the polished surface was analyzed by X-ray diffractometry. Only peaks assigned to a tetragonal perovskite-type structure were observed, and $c_2/a_2$ was 1.007.

Composition Analysis and Impurity Analysis of Piezoelectric Ceramic

The composition of the piezoelectric ceramic was determined by X-ray fluorescence spectroscopy. The result showed that the piezoelectric ceramic according to the present example was composed mainly of a metal oxide represented by the chemical formula $(Ba_{0.813}Ca_{0.187})_{0.9965}$ $(Ti_{0.931}Zr_{0.059}Mn_{0.010})O_3$. The Mg, Fe, Al, and Sr contents were 0.0008, 0.0010, 0.0006, and 0.0001 parts by weight, respectively, per 100 parts by weight of the main component.

The composition of the piezoelectric ceramic was substantially identical to the composition of the ceramic powder. As in the ceramic powder, elements other than Ba, Ca, Ti, Zr, Mn, Mg, Fe, Al, and Sr were not detected. Sintering and polishing did not significantly change the average equivalent circular diameter.

Formation of Electrodes

A gold electrode having a thickness of 400 nm was formed by DC sputtering on the front and back sides of the discoidal piezoelectric ceramic. A titanium film having a thickness of 30 nm was formed as an adhesion layer between the electrodes and the piezoelectric ceramic. The piezoelectric ceramic on which the electrodes were formed was cut into a 10 mm×2.5 mm×0.5 mm plate-like piezoelectric element.

Polarization Treatment

The piezoelectric element was placed on a hot plate having a surface temperature in the range of 110° C. to 140° C. An electric field of 0.6 kV/mm was applied to the electrodes of the piezoelectric element for 10 minutes for polarization treatment. Thus, the piezoelectric element had remanent polarization in the piezoelectric ceramic between the electrodes perpendicular to the electrode surface.

Examples 2 to 38

Ceramic powders according to Examples 2 to 38 were prepared in the same manner as in Example 1. Piezoelectric ceramics and piezoelectric elements were produced from these ceramic powders. The ratio of the raw materials of each ceramic powder is shown in Table 1. In order to adjust the Mg, Fe, Al, and Sr contents of each ceramic powder, magnesium oxide, iron oxide, aluminum oxide, and/or strontium oxide was added to the mixed raw material powder such that the ceramic powder contains more than 0 and not more than 0.1 parts by weight on a metal basis of at least one element of Mg, Fe, Al, and Sr per 100 parts by weight of the raw materials based on the chemical formula $(Ba_{1-x}Ca_x)_\alpha(Ti_{1-y-z}Zr_yMn_z)O_3$. The mixed raw material powder was then dry-blended in a ball mill for 24 hours.

The average equivalent circular diameter, $c_1/a_1$, half-value width, specific surface area, and $I_m/I_{200}$ of the ceramic powders according to Examples 2 to 38 were measured in the same manner as in Example 1. Table 2 shows the results. The composition analysis performed in the same manner as in Example 1 showed that variations in the Mg, Fe, Al, and Sr contents were 0.0001 parts by weight. These variations probably resulted from the raw materials and the production apparatus. With respect to metallic elements other than Mg, Fe, Al, and Sr components, the weighed composition was substantially identical to the composition after sintering within the number of significant digits.

The X-ray diffraction patterns according to Examples 4, 15, 29, and 37 included significant diffraction peaks $I_m$ as well as the diffraction peaks of the perovskite-type crystal phase that formed the primary phase. The structural analysis showed that these diffraction peaks were assigned to a cubic perovskite-type $CaTiO_3$. In the other examples, no significant diffraction peak other than the diffraction peaks of the primary phase was detected ($I_m \approx 0$, $I_m/I_{200} < 0.01$)

TABLE 1

| | Ba 1−x | Ca x | Ti 1−y−z | Zr y | Mn z | Mole ratio α | Mg [parts by weight] | Fe [parts by weight] | Al [parts by weight] | Sr [parts by weight] | Bi [parts by weight] |
|---|---|---|---|---|---|---|---|---|---|---|---|
| Example 1 | 0.813 | 0.187 | 0.931 | 0.059 | 0.010 | 0.9965 | 0.0008 | 0.0010 | 0.0006 | 0.0001 | 0.000 |
| Example 2 | 0.840 | 0.160 | 0.931 | 0.059 | 0.010 | 0.9965 | 0.0009 | 0.0014 | 0.0080 | 0.0022 | 0.000 |
| Example 3 | 0.875 | 0.125 | 0.932 | 0.060 | 0.008 | 0.9962 | 0.0002 | 0.0011 | 0.0003 | 0.0013 | 0.000 |
| Example 4 | 0.700 | 0.300 | 0.933 | 0.060 | 0.007 | 0.9970 | 0.0012 | 0.0009 | 0.0002 | 0.0013 | 0.000 |
| Example 5 | 0.840 | 0.160 | 0.970 | 0.020 | 0.010 | 0.9965 | 0.0003 | 0.0010 | 0.0002 | 0.0020 | 0.000 |
| Example 6 | 0.840 | 0.160 | 0.895 | 0.095 | 0.010 | 0.9965 | 0.0003 | 0.0013 | 0.0002 | 0.0011 | 0.000 |
| Example 7 | 0.840 | 0.160 | 0.937 | 0.060 | 0.003 | 0.9968 | 0.0003 | 0.0012 | 0.0003 | 0.0017 | 0.000 |
| Example 8 | 0.840 | 0.160 | 0.925 | 0.059 | 0.016 | 0.9965 | 0.0002 | 0.0014 | 0.0003 | 0.0015 | 0.000 |
| Example 9 | 0.840 | 0.160 | 0.932 | 0.058 | 0.010 | 0.9900 | 0.0002 | 0.0018 | 0.0003 | 0.0013 | 0.000 |
| Example 10 | 0.840 | 0.160 | 0.932 | 0.058 | 0.010 | 1.0095 | 0.0002 | 0.0011 | 0.0003 | 0.0020 | 0.000 |
| Example 11 | 0.840 | 0.160 | 0.935 | 0.055 | 0.010 | 0.9967 | 0.0002 | 0.0010 | 0.0002 | 0.0014 | 0.000 |
| Example 12 | 0.840 | 0.160 | 0.935 | 0.055 | 0.010 | 0.9900 | 0.0003 | 0.0012 | 0.0002 | 0.0018 | 0.000 |
| Example 13 | 0.840 | 0.160 | 0.926 | 0.064 | 0.010 | 0.9981 | 0.0002 | 0.0016 | 0.0002 | 0.0005 | 0.000 |
| Example 14 | 0.840 | 0.160 | 0.926 | 0.064 | 0.010 | 0.9960 | 0.0002 | 0.0017 | 0.0003 | 0.0001 | 0.000 |
| Example 15 | 0.720 | 0.280 | 0.913 | 0.081 | 0.006 | 1.0003 | 0.0004 | 0.0020 | 0.0003 | 0.0003 | 0.000 |
| Example 16 | 0.813 | 0.187 | 0.931 | 0.059 | 0.010 | 0.9967 | 0.0003 | 0.0011 | 0.0003 | 0.0003 | 0.000 |
| Example 17 | 0.813 | 0.187 | 0.932 | 0.058 | 0.010 | 0.9967 | 0.0003 | 0.0011 | 0.0003 | 0.0003 | 0.000 |
| Example 18 | 0.813 | 0.187 | 0.932 | 0.058 | 0.010 | 0.9967 | 0.0002 | 0.0012 | 0.0002 | 0.0002 | 0.000 |
| Example 19 | 0.813 | 0.187 | 0.931 | 0.059 | 0.010 | 0.9961 | 0.0002 | 0.0010 | 0.0002 | 0.0001 | 0.000 |
| Example 20 | 0.813 | 0.187 | 0.931 | 0.059 | 0.010 | 0.9970 | 0.0002 | 0.0013 | 0.0002 | 0.0003 | 0.000 |
| Example 21 | 0.840 | 0.160 | 0.931 | 0.059 | 0.010 | 0.9966 | 0.0159 | 0.0016 | 0.0300 | 0.0002 | 0.000 |
| Example 22 | 0.840 | 0.160 | 0.931 | 0.059 | 0.010 | 0.9966 | 0.0996 | 0.0010 | 0.0894 | 0.0003 | 0.000 |
| Example 23 | 0.840 | 0.160 | 0.932 | 0.058 | 0.010 | 0.9980 | 0.0003 | 0.0005 | 0.0002 | 0.0001 | 0.000 |
| Example 24 | 0.840 | 0.160 | 0.932 | 0.058 | 0.010 | 0.9975 | 0.0002 | 0.0001 | 0.0003 | 0.0001 | 0.000 |
| Example 25 | 0.840 | 0.160 | 0.932 | 0.058 | 0.010 | 0.9967 | 0.0001 | 0.0001 | 0.0001 | 0.0001 | 0.000 |
| Example 26 | 0.860 | 0.140 | 0.934 | 0.060 | 0.006 | 0.9955 | 0.0001 | 0.0011 | 0.0003 | 0.0003 | 0.170 |
| Example 27 | 0.860 | 0.140 | 0.934 | 0.060 | 0.006 | 0.9955 | 0.0002 | 0.0013 | 0.0002 | 0.0002 | 0.042 |
| Example 28 | 0.860 | 0.140 | 0.934 | 0.060 | 0.006 | 0.9955 | 0.0001 | 0.0014 | 0.0002 | 0.0002 | 0.270 |
| Example 29 | 0.860 | 0.140 | 0.934 | 0.060 | 0.006 | 0.9955 | 0.0001 | 0.0014 | 0.0002 | 0.0002 | 0.850 |
| Example 30 | 0.875 | 0.125 | 0.931 | 0.059 | 0.010 | 1.0053 | 0.0007 | 0.0014 | 0.0002 | 0.0011 | 0.000 |
| Example 31 | 0.700 | 0.300 | 0.931 | 0.059 | 0.010 | 1.0044 | 0.0008 | 0.0012 | 0.0003 | 0.0014 | 0.000 |
| Example 32 | 0.840 | 0.160 | 0.970 | 0.020 | 0.010 | 1.0054 | 0.0004 | 0.0010 | 0.0002 | 0.0003 | 0.000 |
| Example 33 | 0.840 | 0.160 | 0.896 | 0.094 | 0.010 | 1.0068 | 0.0008 | 0.0014 | 0.0003 | 0.0013 | 0.000 |
| Example 34 | 0.840 | 0.160 | 0.937 | 0.060 | 0.003 | 1.0082 | 0.0004 | 0.0010 | 0.0003 | 0.0013 | 0.000 |
| Example 35 | 0.840 | 0.160 | 0.926 | 0.059 | 0.015 | 1.0044 | 0.0008 | 0.0017 | 0.0003 | 0.0011 | 0.000 |
| Example 36 | 0.840 | 0.160 | 0.931 | 0.059 | 0.010 | 1.0093 | 0.0003 | 0.0014 | 0.0002 | 0.0014 | 0.000 |
| Example 37 | 0.720 | 0.280 | 0.934 | 0.060 | 0.006 | 0.9955 | 0.0002 | 0.0013 | 0.0002 | 0.0003 | 0.170 |
| Example 38 | 0.830 | 0.170 | 0.931 | 0.059 | 0.010 | 0.9967 | 0.0009 | 0.0013 | 0.0002 | 0.0003 | 0.000 |
| Comparative example 1 | 0.700 | 0.300 | 0.931 | 0.059 | 0.010 | 0.9970 | 0.0012 | 0.0009 | 0.0002 | 0.0013 | 0.000 |

TABLE 1-continued

| | Ba 1 − x | Ca x | Ti 1 − y − z | Zr y | Mn z | Mole ratio α | Mg [parts by weight] | Fe [parts by weight] | Al [parts by weight] | Sr [parts by weight] | Bi [parts by weight] |
|---|---|---|---|---|---|---|---|---|---|---|---|
| Comparative example 2 | 0.700 | 0.300 | 0.805 | 0.185 | 0.010 | 0.9967 | 0.0012 | 0.0009 | 0.0002 | 0.0013 | 0.000 |
| Comparative example 3 | 0.990 | 0.010 | 0.880 | 0.109 | 0.011 | 0.9967 | 0.0008 | 0.0010 | 0.0003 | 0.0013 | 0.000 |
| Comparative example 4 | 0.650 | 0.350 | 0.932 | 0.059 | 0.009 | 0.9970 | 0.0008 | 0.0009 | 0.0003 | 0.0013 | 0.000 |
| Comparative example 5 | 0.840 | 0.160 | 0.980 | 0.010 | 0.010 | 0.9972 | 0.0009 | 0.0010 | 0.0002 | 0.0014 | 0.000 |
| Comparative example 6 | 0.840 | 0.160 | 0.851 | 0.139 | 0.010 | 0.9972 | 0.0008 | 0.0010 | 0.0005 | 0.0014 | 0.000 |
| Comparative example 7 | 0.840 | 0.160 | 0.940 | 0.060 | 0.000 | 0.9970 | 0.0009 | 0.0009 | 0.0005 | 0.0013 | 0.000 |
| Comparative example 8 | 0.840 | 0.160 | 0.901 | 0.057 | 0.042 | 0.9970 | 0.0009 | 0.0009 | 0.0005 | 0.0014 | 0.000 |
| Comparative example 9 | 0.840 | 0.160 | 0.931 | 0.059 | 0.010 | 1.0500 | 0.0009 | 0.0009 | 0.0003 | 0.0013 | 0.000 |
| Comparative example 10 | 0.840 | 0.160 | 0.931 | 0.059 | 0.010 | 0.9600 | 0.0008 | 0.0010 | 0.0003 | 0.0014 | 0.000 |
| Comparative example 11 | 0.750 | 0.250 | 0.899 | 0.091 | 0.010 | 0.9970 | 0.0002 | 0.0011 | 0.0003 | 0.0013 | 0.000 |

TABLE 2

| | Average equivalent circular diameter [nm] | c/a [—] | Half-value width of (111) 2θ[deg] | Specific surface area [m²/g] | $I_m/I_{200}$ [—] |
|---|---|---|---|---|---|
| Example 1 | 210 | 1.004 | 0.19 | 6.1 | <0.01 |
| Example 2 | 280 | 1.004 | 0.25 | 5.0 | <0.01 |
| Example 3 | 230 | 1.002 | 0.18 | 5.1 | <0.01 |
| Example 4 | 220 | 1.002 | 0.18 | 5.1 | 0.04 |
| Example 5 | 230 | 1.003 | 0.18 | 5.6 | <0.01 |
| Example 6 | 300 | 1.002 | 0.18 | 4.5 | <0.01 |
| Example 7 | 190 | 1.003 | 0.19 | 6.2 | <0.01 |
| Example 8 | 450 | 1.007 | 0.19 | 4.9 | <0.01 |
| Example 9 | 550 | 1.006 | 0.18 | 4.8 | <0.01 |
| Example 10 | 160 | 1.001 | 0.18 | 5.1 | <0.01 |
| Example 11 | 100 | 1.003 | 0.19 | 9.6 | <0.01 |
| Example 12 | 990 | 1.010 | 0.14 | 2.4 | <0.01 |
| Example 13 | 320 | 1.001 | 0.19 | 5.2 | <0.01 |
| Example 14 | 260 | 1.010 | 0.13 | 4.9 | <0.01 |
| Example 15 | 200 | 1.003 | 0.16 | 5.0 | 0.05 |
| Example 16 | 250 | 1.001 | 0.12 | 5.1 | <0.01 |
| Example 17 | 250 | 1.001 | 0.18 | 5.0 | <0.01 |
| Example 18 | 260 | 1.003 | 0.19 | 5.2 | <0.01 |
| Example 19 | 890 | 1.003 | 0.18 | 1.0 | <0.01 |
| Example 20 | 200 | 1.003 | 0.17 | 9.8 | <0.01 |
| Example 21 | 220 | 1.002 | 0.19 | 5.6 | <0.01 |
| Example 22 | 230 | 1.002 | 0.19 | 5.6 | <0.01 |
| Example 23 | 210 | 1.004 | 0.19 | 5.6 | <0.01 |
| Example 24 | 210 | 1.003 | 0.19 | 5.5 | <0.01 |
| Example 25 | 220 | 1.000 | 0.17 | 5.6 | <0.01 |
| Example 26 | 220 | 1.000 | 0.24 | 5.4 | <0.01 |
| Example 27 | 220 | 1.000 | 0.24 | 5.3 | <0.01 |
| Example 28 | 210 | 1.000 | 0.23 | 5.3 | <0.01 |
| Example 29 | 220 | 1.003 | 0.19 | 5.3 | 0.05 |
| Example 30 | 280 | 1.004 | 0.19 | 5.3 | <0.01 |
| Example 31 | 290 | 1.003 | 0.19 | 5.2 | <0.01 |
| Example 32 | 280 | 1.003 | 0.19 | 5.6 | <0.01 |
| Example 33 | 280 | 1.002 | 0.19 | 5.7 | <0.01 |
| Example 34 | 230 | 1.004 | 0.17 | 5.7 | <0.01 |
| Example 35 | 300 | 1.003 | 0.17 | 5.9 | <0.01 |
| Example 36 | 220 | 1.004 | 0.17 | 6.0 | <0.01 |
| Example 37 | 210 | 1.000 | 0.19 | 5.6 | 0.10 |
| Example 38 | 210 | 1.003 | 0.18 | 5.5 | <0.01 |
| Comparative example 1 | 220 | 1.002 | 0.19 | 5.1 | 0.15 |
| Comparative example 2 | 1200 | 1.010 | 0.17 | 13.0 | <0.01 |
| Comparative example 3 | 210 | 1.010 | 0.18 | 5.2 | <0.01 |
| Comparative example 4 | 220 | 1.002 | 0.19 | 5.6 | 0.10 |
| Comparative example 5 | 230 | 1.002 | 0.19 | 5.3 | <0.01 |
| Comparative example 6 | 250 | 1.000 | 0.18 | 5.4 | <0.01 |
| Comparative example 7 | 230 | 1.003 | 0.19 | 5.4 | <0.01 |
| Comparative example 8 | 230 | 1.002 | 0.18 | 5.5 | 0.06 |
| Comparative example 9 | 200 | 1.004 | 0.19 | 5.2 | <0.01 |
| Comparative example 10 | 210 | 1.003 | 0.18 | 5.5 | <0.01 |
| Comparative example 11 | 220 | 1.002 | 0.19 | 5.2 | 0.16 |

TABLE 3

| | Mole ratio β | Average equivalent circular diameter of crystal grains [μm] | c/a [—] | Relative density [%] |
|---|---|---|---|---|
| Example 1 | 1.0068 | 7.0 | 1.007 | 98 |
| Example 2 | 1.0069 | 7.0 | 1.007 | 97 |
| Example 3 | 1.0043 | 8.0 | 1.008 | 96 |
| Example 4 | 1.0045 | 9.0 | 1.008 | 98 |
| Example 5 | 1.0068 | 7.0 | 1.005 | 97 |
| Example 6 | 1.0070 | 7.0 | 1.003 | 97 |
| Example 7 | 0.9998 | 10.0 | 1.008 | 96 |
| Example 8 | 1.0127 | 7.0 | 1.008 | 96 |
| Example 9 | 1.0003 | 10.0 | 1.008 | 97 |
| Example 10 | 1.0200 | 0.3 | 1.008 | 96 |
| Example 11 | 1.0071 | 6.0 | 1.008 | 97 |
| Example 12 | 1.0003 | 8.0 | 1.010 | 97 |
| Example 13 | 1.0085 | 3.0 | 1.005 | 97 |
| Example 14 | 1.0064 | 9.0 | 1.010 | 97 |
| Example 15 | 1.0064 | 1.0 | 1.008 | 98 |
| Example 16 | 1.0070 | 8.0 | 1.007 | 96 |
| Example 17 | 1.0070 | 7.0 | 1.007 | 97 |
| Example 18 | 1.0070 | 8.0 | 1.008 | 96 |

TABLE 3-continued

| | Mole ratio β | Average equivalent circular diameter of crystal grains [μm] | c/a [—] | Relative density [%] |
|---|---|---|---|---|
| Example 19 | 1.0064 | 7.0 | 1.006 | 96 |
| Example 20 | 1.0073 | 6.0 | 1.005 | 97 |
| Example 21 | 1.0070 | 6.0 | 1.006 | 97 |
| Example 22 | 1.0070 | 6.0 | 1.006 | 96 |
| Example 23 | 1.0084 | 5.0 | 1.008 | 96 |
| Example 24 | 1.0079 | 8.0 | 1.008 | 97 |
| Example 25 | 1.0071 | 5.0 | 1.008 | 97 |
| Example 26 | 1.0019 | 8.0 | 1.008 | 98 |
| Example 27 | 1.0019 | 8.0 | 1.007 | 95 |
| Example 28 | 1.0019 | 8.0 | 1.007 | 96 |
| Example 29 | 1.0019 | 8.0 | 1.007 | 94 |
| Example 30 | 1.0159 | 3.0 | 1.006 | 96 |
| Example 31 | 1.0142 | 5.0 | 1.007 | 96 |
| Example 32 | 1.0158 | 3.0 | 1.007 | 96 |
| Example 33 | 1.0174 | 4.0 | 1.003 | 95 |
| Example 34 | 1.0114 | 5.0 | 1.007 | 96 |
| Example 35 | 1.0197 | 4.0 | 1.007 | 96 |
| Example 36 | 1.0198 | 2.0 | 1.007 | 96 |
| Example 37 | 1.0015 | 8.0 | 1.008 | 96 |
| Example 38 | 1.0070 | 7.0 | 1.008 | 95 |
| Comparative example 1 | 1.0067 | 9.0 | 1.008 | 95 |
| Comparative example 2 | 1.0067 | 2.0 | 1.005 | 93 |
| Comparative example 3 | 1.0079 | 6.0 | 1.007 | 95 |
| Comparative example 4 | 1.0065 | 7.0 | 1.003 | 94 |
| Comparative example 5 | 1.0075 | 5.0 | 1.005 | 94 |
| Comparative example 6 | 1.0078 | 4.0 | 1.002 | 93 |
| Comparative example 7 | 0.9970 | 6.0 | 1.005 | 95 |
| Comparative example 8 | 1.0410 | 5.0 | 1.006 | 94 |
| Comparative example 9 | 1.0609 | 0.2 | — | — |
| Comparative example 10 | 0.9700 | 120.0 | — | — |
| Comparative example 11 | 1.0070 | 8.0 | 1.008 | 95 |

Effects of Sintering Temperature

Piezoelectric ceramics were produced in the same manner as in Examples 1 to 38 except that the maximum sintering temperature was 1200° C. or 1400° C. The composition after weighing was substantially identical to the composition after sintering. The crystal structure was a perovskite structure alone. The average equivalent circular diameter ranged from 0.3 to 10 μm. The relative density was 94% or more.

Comparative Examples 1 to 11

Piezoelectric elements according to Comparative Examples 1 to 11 were produced in the same manner as in Example 1.

In Comparative Example 1, a ceramic powder was produced by heating the raw materials in an electric furnace from room temperature to 600° C. over 5 hours and holding the raw materials at 600° C. for 10 hours.

In Comparative Example 2, the Ti raw material was a titanium oxide ($TiO_2$) powder (average particle size: 1000 nm, purity: 99.9% or more), and the Zr raw material was a zirconium oxide ($ZrO_2$) powder (average particle size: 1000 nm, purity: 99.9% or more). The other raw materials were the same as in Example 1.

The compositions of comparative ceramics constituting the piezoelectric elements were shown in Table 1.

In Comparative Example 11, the raw material having a composition represented by the general formula $(Ba_{1-x}Ca_x)_\alpha(Ti_{1-y-z}Zr_yMn_z)O_3$ in which x=0.250, y=0.091, z=0.010, and α=0.9970: $(Ba_{0.75}Ca_{0.250})_{0.9970}(Ti_{0.899}Zr_{0.091}Mn_{0.010})O_3$ was produced as described below.

A barium titanate ($BaTiO_3$) powder (average particle size: 200 nm, purity: 99.9% or more) was prepared as a Ba and Ti raw material. A calcium titanate ($CaTiO_3$) powder (average particle size: 500 nm, purity: 99.9% or more) was prepared as a Ca and Ti raw material. A calcium zirconate ($CaZrO_3$) powder (average particle size: 500 nm, purity: 99.9% or more) was prepared as a Ca and Zr raw material. A trimanganese tetroxide ($Mn_3O_4$) powder (average particle size: 1300 nm, purity: 99.5% or more) was prepared as a Mn raw material. These powders were weighed and mixed such that Ba, Ca, Ti, Zr, and Mn satisfied the composition $(Ba_{0.750}Ca_{0.250})_{0.9970}$ $(Ti_{0.899}Zr_{0.091}Mn_{0.010})O_3$. Barium carbonate was used to adjust α, which represents the mole ratio of the A site to the B site. These weighed powders were dry blended in a ball mill using alumina balls for 24 hours.

Firing

The mixed powder in a platinum crucible was heated in an electric furnace from room temperature to 1150° C. over 5 hours and was held at 1150° C. for 10 hours to form a ceramic powder.

In Example 11, the mixed powder was not subjected to heat treatment and was directly used as a ceramic powder.

The average equivalent circular diameter, $c_1/a_1$, half-value width, specific surface area, and $I_m/I_{200}$ of the comparative ceramic powders were measured in the same manner as in Example 1. Table 2 shows the results.

A composition analysis performed in the same manner as in Example 1 showed that the weighed composition of any of the samples listed in Table 1 was substantially identical to the composition after sintering within the number of significant digits.

The ceramic powders according to Comparative Examples 1 and 11 had very large X-ray diffraction peaks of $CaTiO_3$, indicating that these ceramic powders did not have a single perovskite-type crystal phase.

The ceramic powders according to Comparative Examples 1 to 11 were molded in the same manner as in Example 1 and were fired in an electric furnace to form ceramics. The ceramic according to Comparative Example 9 was insufficiently sintered. The ceramic according to Comparative Example 10 contained abnormally grown grains. The ceramics according to Comparative Examples 9 and 10 were broken when they were taken from the electric furnace. Thus, the average equivalent circular diameter of the crystal grains of the ceramics according to Comparative Examples 9 and 10 was not measured, as shown in Table 3.

Characteristic Evaluation of Piezoelectric Elements and Comparative Piezoelectric Elements Measurement of Mechanical Strength The mechanical strength was measured in accordance with Japanese Industrial Standards JIS (JIS R 1601, Testing method for flexural strength (modulus of rupture) of fine ceramics at room temperature). The piezoelectric ceramics according to Examples 1 to 38 and Comparative Examples 1 to 8 and 11 were cut into 36 mm×3 mm×4 mm test specimens. The breaking loads of the test specimens were measured in a four-point bending test. The bending strength was calculated from the breaking load. Table 4 shows the results.

The piezoelectric constant $d_{31}$ and mechanical quality factor $Q_m$ of the piezoelectric elements manufactured from the ceramic powders according to Examples 1 to 38 and the piezoelectric elements according to Comparative Examples 1 to 8 and 11 were determined at room temperature (27° C.). Table 4 shows the results.

The ceramic powders used in the production of the piezoelectric ceramics and piezoelectric elements are listed in the leftmost column of Table 4.

The piezoelectric constant $d_{31}$ was measured at room temperature using a resonance-antiresonance method. Table 4 shows the absolute value of the piezoelectric constant $d_{31}$. The mechanical quality factor $Q_m$ was measured simultaneously with the piezoelectric constant using the resonance-antiresonance method.

TABLE 4

|  | Piezoelectric constant $|d_{31}|$ [pm/V] | Mechanical quality factor Qm [—] | Mechanical strength [MPa] |
| --- | --- | --- | --- |
| Example 1 | 97 | 1483 | 120 |
| Example 2 | 97 | 1600 | 140 |
| Example 3 | 96 | 1520 | 121 |
| Example 4 | 60 | 1380 | 120 |
| Example 5 | 95 | 1531 | 122 |
| Example 6 | 97 | 1540 | 117 |
| Example 7 | 97 | 1130 | 122 |
| Example 8 | 94 | 1613 | 123 |
| Example 9 | 96 | 1546 | 119 |
| Example 10 | 101 | 1405 | 116 |
| Example 11 | 94 | 1410 | 115 |
| Example 12 | 94 | 1541 | 121 |
| Example 13 | 95 | 1454 | 118 |
| Example 14 | 65 | 1484 | 116 |
| Example 15 | 71 | 1320 | 116 |
| Example 16 | 90 | 1461 | 116 |
| Example 17 | 90 | 1465 | 115 |
| Example 18 | 98 | 1487 | 116 |
| Example 19 | 97 | 1501 | 116 |
| Example 20 | 97 | 1410 | 117 |
| Example 21 | 98 | 1541 | 118 |
| Example 22 | 98 | 1551 | 118 |
| Example 23 | 98 | 1527 | 120 |
| Example 24 | 98 | 1518 | 120 |
| Example 25 | 99 | 1540 | 120 |
| Example 26 | 101 | 1690 | 146 |
| Example 27 | 98 | 1655 | 146 |
| Example 28 | 98 | 1644 | 148 |
| Example 29 | 98 | 1644 | 148 |
| Example 30 | 99 | 1445 | 120 |
| Example 31 | 75 | 1427 | 122 |
| Example 32 | 98 | 1423 | 125 |
| Example 33 | 105 | 1422 | 123 |
| Example 34 | 98 | 1425 | 121 |
| Example 35 | 95 | 1420 | 120 |
| Example 36 | 98 | 1410 | 120 |
| Example 37 | 63 | 1109 | 126 |
| Example 38 | 110 | 1460 | 130 |
| Comparative example 1 | 55 | 850 | 108 |
| Comparative example 2 | 54 | 1050 | 75 |
| Comparative example 3 | 50 | 1410 | 115 |
| Comparative example 4 | 45 | 1408 | 114 |
| Comparative example 5 | 55 | 1523 | 116 |
| Comparative example 6 | 101 | 325 | 110 |
| Comparative example 7 | 95 | 150 | 115 |
| Comparative example 8 | 42 | 1458 | 115 |
| Comparative example 9 | — | — | — |
| Comparative example 10 | — | — | — |
| Comparative example 11 | 85 | 945 | 120 |

Effects of Electrode Material

A piezoelectric element was manufactured in the same manner as in the piezoelectric elements manufactured from the ceramic powders prepared in Examples 1 to 38 except that the electrodes were formed by baking a silver paste. The piezoelectric element had substantially the same characteristics as the piezoelectric elements having gold electrodes according to examples of the present invention.

Characteristics of Examples and Comparative Examples

The piezoelectric elements manufactured from the ceramic powders according to Examples 1 to 38 had a piezoelectric constant $d_{31}$ as high as 60 or more and are suitable for practical use in piezoelectric devices. The piezoelectric elements manufactured from the ceramic powders according to Examples 1 to 30 had a mechanical quality factor $Q_m$ of 1100 or more and are suitable for practical use in resonance-type piezoelectric devices.

The piezoelectric elements manufactured from the ceramic powders according to Comparative Examples 1 and 11 had a low mechanical quality factor. This is probably due to a nonuniform piezoelectric effect.

The piezoelectric element manufactured from the ceramic powder according to Comparative Example 2 had a low mechanical strength. This is probably due to breakage resulting from a pore.

The piezoelectric elements manufactured from the ceramic powders according to Comparative Examples 3 to 5 and 8 had a very low piezoelectric constant. The piezoelectric elements manufactured from the ceramic powders according to Comparative Examples 6 and 7 had a very low mechanical quality factor.

A multilayered piezoelectric element according to an example of the present invention was manufactured.

Multilayered Piezoelectric Element

Example 39

A raw material was weighed as described below. The raw material had a composition represented by the general formula $(Ba_{1-x}Ca_x)_\alpha(Ti_{1-y-z}Zr_yMn_z)O_3$ in which $x=0.187$, $y=0.059$, $z=0.010$, and $\alpha=0.9965$:

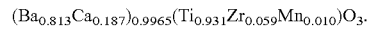
$(Ba_{0.813}Ca_{0.187})_{0.9965}(Ti_{0.931}Zr_{0.059}Mn_{0.010})O_3$.

A barium carbonate ($BaCO_3$) powder (average particle size: 600 nm, purity: 99.9% or more) was prepared as a Ba raw material. A calcium carbonate ($CaCO_3$) powder (average particle size: 1000 nm, purity: 99.9% or more) was prepared as a Ca raw material. A titanium oxide ($TiO_2$) powder (average particle size: 50 nm, purity: 99.9% or more) was prepared as a Ti raw material. A zirconium oxide ($ZrO_2$) powder (average particle size: 100 nm, purity: 99.9% or more) was prepared as a Zr raw material. A trimanganese tetroxide ($Mn_3O_4$) powder (average particle size: 1300 nm, purity: 99.5% or more) was prepared as a Mn raw material. These powders were weighed such that Ba, Ca, Ti, Zr, and Mn satisfied the composition

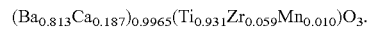
$(Ba_{0.813}Ca_{0.187})_{0.9965}(Ti_{0.931}Zr_{0.059}Mn_{0.010})O_3$.

Table 1 shows the mixing ratio of the raw materials. Barium carbonate was used to adjust a, which represents the mole ratio of the A site to the B site. These weighed powders were dry-blended in a ball mill for 24 hours.

Silicon dioxide and boron oxide were added to the mixed powder such that the amounts of Si and B were 0.014 and 0.0066 parts by weight, respectively, per 100 parts by weight of the composition $(Ba_{0.813}Ca_{0.187})_{0.9965}$ $(Ti_{0.931}Zr_{0.059}Mn_{0.010})O_3$. Si and B were added to lower the firing temperature. These amounts of Si and B were minimum amounts that allow firing at 1150° C. For example, although 0.040 parts by weight of Si was acceptable in terms of firing, this resulted in a decrease in piezoelectric constant by 15% or more. Thus, the amount of Si was 0.014 parts by weight.

The mixed powder was mixed with a poly(vinyl butyral) (PVB) binder and was formed into a green sheet having a thickness of 50 m by a doctor blade method.

An electrically conductive paste for an internal electrode was applied to the green sheet. The electrically conductive paste was a 70% Ag-30% Pd alloy (Ag/Pd=2.33) paste. Nine green sheets to which the electrically conductive paste was applied were stacked. The layered body was first heated to 400° C. in the ambient atmosphere in a variable atmosphere electric furnace to remove the organic binder component. A hydrogen-nitrogen gas mixture was then introduced into the electric furnace, and the oxygen partial pressure was adjusted to be $1.0 \times 10^{-10}$ MPa. The layered body was then heated in the electric furnace at a maximum temperature of 1150° C. for 5 hours. The layered body was then cooled to 1000° C. while maintaining the oxygen partial pressure. The oxygen partial pressure was then increased to $3.0 \times 10^{-4}$ MPa, and the layered body was cooled to 300° C., thus forming a sintered body.

The composition of the sintered body was analyzed by ICP spectroscopy.

The result showed that the sintered body was composed mainly of a metal oxide represented by the chemical formula $(Ba_{0.813}Ca_{0.187})_{0.9965}(Ti_{0.931}Zr_{0.059}Mn_{0.010})O_3$. The Mg, Fe, Al, and Sr contents were 0.0008, 0.0010, 0.0006, and 0.0001 parts by weight, respectively, per 100 parts by weight of the main component.

The composition of the sintered body was substantially identical to the composition of the ceramic powder. As in the ceramic powder, elements other than Ba, Ca, Ti, Zr, Mn, Mg, Fe, Al, Sr, Si, and B were not detected. Sintering and polishing did not significantly change the average equivalent circular diameter.

The sintered body was cut into a 10 mm×2.5 mm piece. The side surfaces of the piece were polished. A pair of external electrodes (a first electrode and a second electrode) for alternately connecting internal electrodes were formed in a Au sputtering process. Thus, a multilayered piezoelectric element as illustrated in FIG. 2B was manufactured.

The multilayered piezoelectric element included nine piezoelectric ceramic layers and eight internal electrodes.

The observation of the internal electrodes of the multilayered piezoelectric element showed that the electrode material Ag—Pd and the piezoelectric ceramic were alternately stacked on top of one another.

Before the evaluation of piezoelectricity, a sample was subjected to polarization treatment. More specifically, the sample was heated to a temperature in the range of 100° C. to 150° C. on a hot plate. A voltage of 0.6 kV/mm was applied between the first electrode and the second electrode for 10 minutes, and the sample was cooled to room temperature while the voltage was maintained.

The evaluation of the piezoelectricity of the multilayered piezoelectric element showed that the multilayered piezoelectric element had a satisfactory insulation property and had a high piezoelectric constant similar to that of the piezoelectric ceramic formed of the ceramic powder according to Example 1. The piezoelectric ceramic layers had remanent polarization in alternate directions along the stacking direction.

Example 40

An electrically conductive paste for an internal electrode was applied to a green sheet manufactured in the same manner as in Example 39. The electrically conductive paste was a Ni paste. Nine green sheets to which the electrically conductive paste had been applied were stacked and were heat-pressed.

The heat-pressed layered body was first heated to 400° C. in the ambient atmosphere in a variable atmosphere electric furnace to remove the organic binder component. A hydrogen-nitrogen gas mixture was then introduced into the electric furnace, and the oxygen partial pressure was adjusted to be $1.0 \times 10^{-10}$ MPa. The layered body was then heated in the electric furnace at a maximum temperature of 1150° C. for 5 hours. The layered body was then cooled to 1000° C. while maintaining the oxygen partial pressure. The oxygen partial pressure was then increased to $3.0 \times 10^{-4}$ MPa, and the layered body was cooled to 300° C., thus forming a sintered body.

The sintered body was cut into a 10 mm×2.5 mm piece. The side surfaces of the piece were polished. A pair of external electrodes (a first electrode and a second electrode) for alternately connecting internal electrodes were formed in a Au sputtering process. Thus, a multilayered piezoelectric element as illustrated in FIG. 2B was manufactured.

The observation of the internal electrodes of the multilayered piezoelectric element showed that the electrode material (electrode layer) Ni and the piezoelectric ceramic layers were alternately stacked on top of one another. The multilayered piezoelectric element was heated to 80° C. on a hot plate. While a voltage of 4.0 kV/mm was applied between the first electrode and the second electrode for 30 minutes, the sample was cooled to room temperature.

The evaluation of the piezoelectricity of the multilayered piezoelectric element showed that the multilayered piezoelectric element had a satisfactory insulation property and had a high piezoelectric constant similar to that of the piezoelectric ceramic according to Example 1. The piezoelectric ceramic layers had remanent polarization in alternate directions along the stacking direction.

Comparative Example 12

A multilayered piezoelectric element was manufactured in the same manner as in Example 39, except that the internal electrodes were formed of a 95% Ag-5% Pd alloy (Ag/Pd=19).

The internal electrodes were observed with a scanning electron microscope. The observation showed that the internal electrodes were melted and interspersed as islands. Furthermore, the alloy electrodes were reduced and had greatly decreased electrical conductivity. Thus, the internal electrodes were not conductive, and the multilayered piezoelectric element was not polarized. Thus, the piezoelectric constant could not be measured.

Comparative Example 13

A multilayered piezoelectric element was manufactured in the same manner as in Comparative Example 12 except that the internal electrodes were formed of a 5% Ag-95% Pd alloy (Ag/Pd=0.05).

The internal electrodes were observed with a scanning electron microscope. The observation showed that sintering of the electrode material Ag—Pd was insufficient. Thus, the internal electrodes were not conductive, and the multilayered piezoelectric element was not polarized. Thus, the piezoelectric constant could not be measured.

Example 41

A liquid discharge head illustrated in FIGS. 3A and 3B that included the piezoelectric element according to Example 1 was manufactured. An ink was discharged in response to the input of an electric signal.

Example 42

A liquid discharge apparatus illustrated in FIG. 4 that included the liquid discharge head according to Example 41 was manufactured. An ink was discharged onto an object in response to the input of an electric signal.

Example 43

An ultrasonic motor illustrated in FIG. 6A that included the piezoelectric element according to Example 1 was manufactured. The motor rotated in response to the application of an alternating voltage.

Example 44

An optical apparatus illustrated in FIGS. 7A and 7B that included the ultrasonic motor according to Example 43 was manufactured. Automatic focusing in response to the application of an alternating voltage was observed.

Example 45

A dust removing device illustrated in FIGS. 9A and 9B that included the piezoelectric element according to Example 1 was manufactured. After plastic beads were scattered, the dust removing device could efficiently remove the plastic beads in response to the application of an alternating voltage.

Example 46

An image pickup apparatus illustrated in FIG. 12 that included the dust removing device according to Example 45 was manufactured. The dust removing device could remove dust on the surface of the image pickup unit, and images free of dust defects were obtained.

Example 47

Electronic equipment illustrated in FIG. 14 that included the piezoelectric element according to Example 1 was manufactured. A loudspeaker of the electronic equipment operated in response to the application of an alternating voltage.

Example 48

A liquid discharge head illustrated in FIGS. 3A and 3B that included the multilayered piezoelectric element according to Example 40 was manufactured. An ink was discharged in response to the input of an electric signal.

Example 49

A liquid discharge apparatus illustrated in FIG. 4 that included the liquid discharge head according to Example 48 was manufactured. An ink was discharged onto a recording medium in response to the input of an electric signal.

Example 50

An ultrasonic motor illustrated in FIG. 6B that included the multilayered piezoelectric element according to Example 40 was manufactured. The motor rotated in response to the application of an alternating voltage.

Example 51

An optical apparatus illustrated in FIGS. 7A and 7B that included the ultrasonic motor according to Example 50 was manufactured. Automatic focusing in response to the application of an alternating voltage was observed.

Example 52

A dust removing device illustrated in FIGS. 9A and 9B that included the multilayered piezoelectric element according to Example 40 was manufactured. After plastic beads were scattered, the dust removing device could efficiently remove the plastic beads in response to the application of an alternating voltage.

Example 53

An image pickup apparatus illustrated in FIG. 12 that included the dust removing device according to Example 52 was manufactured. The dust removing device could remove dust on the surface of the image pickup unit, and images free of dust defects were obtained.

Example 54

Electronic equipment illustrated in FIG. 14 that included the multilayered piezoelectric element according to Example 40 was manufactured. A loudspeaker of the electronic equipment operated in response to the application of an alternating voltage.

A piezoelectric ceramic according to an embodiment of the present invention and a ceramic powder that serves as a raw material for the piezoelectric ceramic have a high piezoelectric constant and mechanical quality factor. The piezoelectric ceramic and the ceramic powder contain no lead and can decrease the load on the environment. Thus, a piezoelectric ceramic according to an embodiment of the present invention and a ceramic powder that serves as a raw material for the piezoelectric ceramic can be utilized without problems in piezoelectric equipment, such as piezoelectric elements, multilayered piezoelectric elements, liquid discharge heads, liquid discharge apparatuses, ultrasonic motors, optical apparatuses, vibratory apparatuses, dust removing devices, image pickup apparatuses, and electronic equipment.

While the present invention has been described with reference to examples, it is to be understood that the invention is not limited to the disclosed examples. The scope of the following claims is to be accorded the broadest interpretation so as to encompass all such modifications and equivalent structures and functions.

This application claims the benefit of Japanese Patent Application No. 2014-045625 filed Mar. 7, 2014, which is hereby incorporated by reference herein in its entirety.

What is claimed is:

1. A metal oxide powder, comprising a metal oxide represented by the general formula (1), $(Ba_{1-x}Ca_x)_\alpha(Ti_{1-y-z}Zr_yMn_z)O_3$ (0.9900≤α≤1.0100, 0.125≤x≤0.300, 0.020≤y≤0.095, 0.003≤z≤0.016)

wherein the metal oxide powder has a perovskite-type crystal phase, and the metal oxide powder is composed of particles having an average equivalent circular diameter in the range of 100 nm or more and less than 1000 nm and has a ratio $c_1/a_1$ in the range of $1.000 \leq c_1/a_1 \leq 1.010$, wherein $c_1$ and $a_1$ denote the c-axis length and a-axis length, respectively, of unit cells of the perovskite-type metal oxide, $c_1$ being greater than or equal to $a_1$.

2. The metal oxide powder according to claim 1, wherein the metal oxide powder has a (111) diffraction peak half-value width of 0.12 degrees or more as determined using X-ray powder diffraction.

3. The metal oxide powder according to claim 1, wherein the metal oxide powder has a specific surface area in the range of 1 m²/g or more and less than 10 m²/g as measured using a BET method.

4. The metal oxide powder according to claim 1, wherein the metal oxide powder contains more than 0 and not more than 0.1 parts by weight on a metal basis of at least one element of Mg, Fe, Al, and Sr per 100 parts by weight of the metal oxide powder.

5. The metal oxide powder according to claim 1, wherein the metal oxide powder contains Bi, and the Bi content ranges from 0.042 to 0.850 parts by weight on a metal basis per 100 parts by weight of the metal oxide.

6. The metal oxide powder according to claim 1, wherein the metal oxide powder has an X-ray diffraction pattern that satisfies $I_m/I_{200} \leq 0.10$, wherein $I_m$ denotes the maximum integrated intensity of diffraction peaks other than those of the perovskite-type crystal phase, and $I_{200}$ denotes the integrated intensity for (200) of the perovskite-type crystal phase.

7. The metal oxide powder according to claim 6, wherein the X-ray diffraction pattern of the metal oxide powder is assigned to the single perovskite-type crystal phase.

8. A piezoelectric material made from the metal oxide powder according to claim 1.

9. The piezoelectric material according to claim 8, wherein the average equivalent circular diameter of crystal grains of the piezoelectric material is greater than the average equivalent circular diameter of particles of the metal oxide powder.

10. The piezoelectric material according to claim 8, wherein a ratio $c_2/a_2$ is greater than the ratio $c_1/a_1$ of particles of the metal oxide powder, wherein $c_2$ and $a_2$ denote the c-axis length and a-axis length, respectively, of unit cells of the piezoelectric material, $c_2$ being greater than or equal to $a_2$.

11. A piezoelectric material comprising: a perovskite-type metal oxide represented by the general formula (2), wherein the metal oxide contains manganese, and the Mn content ranges from 0.02 to 0.40 parts by weight on a metal basis per 100 parts by weight of the metal oxide, $(Ba_{1-x'}Ca_{x'})_\beta(Ti_{1-y'}Zr_{y'})O_3$ (2) (1.0100≤β1.0200, 0.125≤x'≤0.300, 0.020≤y'≤0.095) formula (2).

12. The piezoelectric material according to claim 11, wherein the piezoelectric material contains crystal grains having an average equivalent circular diameter in the range of 0.3 to 10 μm.

13. The piezoelectric material according to claim 11, wherein the piezoelectric material contains more than 0 and not more than 0.1 parts by weight on a metal basis of at least one element of Mg, Fe, Al, and Sr per 100 parts by weight of the piezoelectric material.

14. A piezoelectric element, comprising: a first electrode; a piezoelectric material according to claim 11; and a second electrode.

15. A multilayered piezoelectric element, comprising: a plurality of piezoelectric material layers and a plurality of electrode layers alternately stacked on top of one another, wherein the piezoelectric material layers are formed of the piezoelectric material according to claim 11.

16. A liquid discharge head, comprising: a liquid chamber having a vibrating portion that includes the piezoelectric element according to claim 14; and an orifice for discharging in communication with the liquid chamber.

17. A liquid discharge apparatus, comprising: a stage configured to receive an object; and the liquid discharge head according to claim 16.

18. An ultrasonic motor, comprising: a vibrating member that includes the piezoelectric element according to claim 14; and a moving body in contact with the vibrating member.

19. An optical apparatus, comprising a drive unit that includes the ultrasonic motor according to claim 18.

20. A vibratory apparatus, comprising a vibrating member that includes the piezoelectric element according to claim 14 on a diaphragm.

21. A dust removing device, comprising the vibratory apparatus according to claim 20 in a vibrating portion.

22. An image pickup apparatus, comprising: the dust removing device according to claim 21; and an image pickup element unit, wherein the diaphragm of the vibratory apparatus of the dust removing device is disposed on a light-receiving surface side of the image pickup element unit.

23. Electronic equipment, comprising a piezoelectric acoustic component that includes the piezoelectric element according to claim 14.

24. A liquid discharge head, comprising: a liquid chamber having a vibrating portion that includes the multilayered piezoelectric element according to claim 15; and an orifice for discharging in communication with the liquid chamber.

25. A liquid discharge apparatus, comprising: a stage configured to receive an object; and the liquid discharge head according to claim 24.

26. An ultrasonic motor, comprising: a vibrating member that includes the multilayered piezoelectric element according to claim 15; and a moving body in contact with the vibrating member.

27. An optical apparatus, comprising a drive unit that includes the ultrasonic motor according to claim 26.

28. A vibratory apparatus, comprising a vibrating member that includes the multilayered piezoelectric element according to claim 15 on a diaphragm.

29. A dust removing device, comprising the vibratory apparatus according to claim 28 in a vibrating portion.

30. An image pickup apparatus, comprising: the dust removing device according to claim 29; and an image pickup element unit, wherein the diaphragm of the vibratory apparatus of the dust removing device is disposed on a light-receiving surface side of the image pickup element unit.

31. Electronic equipment, comprising a piezoelectric acoustic component that includes the multilayered piezoelectric element according to claim 15.

32. Electronic equipment, comprising the piezoelectric element according to claim 14.

33. Electronic equipment, comprising the multilayered piezoelectric element according to claim 15.

34. A piezoelectric element, comprising:
a first electrode;
a piezoelectric material according to claim 8; and
a second electrode.

35. A metal oxide powder, comprising Ba, Ca, Ti, Zr, and Mn,
wherein x, which is a mole ratio of Ca in relation to sum of Ba and Ca, is in a range of $0.125 \leq x \leq 0.300$;
wherein y, which is a mole ratio of Zr in relation to sum of Ti, Zr, and Mn, is in a range of $0.020 \leq y \leq 0.095$;
wherein z, which is a mole ratio of Mn in relation to sum of Ti, Zr, and Mn, is in a range of $0.003 \leq z \leq 0.016$;
wherein $\alpha$, which is a mole ratio of sum of Ba and Ca in relation to sum of Ti, Zr, and Mn, is in a range of $0.9900 \leq \alpha \leq 1.0100$;
wherein the metal oxide powder has a perovskite-type crystal phase; and
wherein the metal oxide powder is composed of particles having an average equivalent circular diameter in the range of 100 nm or more and less than 1000 nm and has a ratio $c_1/a_1$ in the range of $1.000 \leq c_1/a_1 \leq 1.010$, wherein $c_1$ and $a_1$ denote the c-axis length and a-axis length, respectively, of unit cells of the perovskite-type metal oxide, $c_1$ being greater than or equal to $a_1$.

36. The metal oxide powder according to claim 35,
wherein the metal oxide powder has an X-ray diffraction pattern that satisfies $I_m/I_{200} \leq 0.10$, and
wherein $I_m$ denotes the maximum integrated intensity of diffraction peaks other than those of the perovskite-type crystal phase, and $I_{200}$ denotes the integrated intensity for (200) of the perovskite-type crystal phase.

37. A piezoelectric material made from the metal oxide powder according to claim 35.

38. A piezoelectric element, comprising:
a first electrode;
a piezoelectric material according to claim 37; and
a second electrode.

39. Electronic equipment, comprising the piezoelectric element according to claim 38.

40. A piezoelectric material, comprising:
a metal oxide including Ba, Ca, Ti, and Zr, and Mn,
wherein x', which is a mole ratio of Ca in relation to sum of Ba and Ca, is in a range of $0.125 \leq x' \leq 0.300$;
wherein y', which is a mole ratio of Zr in relation to sum of Ti and Zr, is in a range of $0.020 \leq y' \leq 0.095$;
wherein the Mn content ranges from 0.02 to 0.40 parts by weight on a metal basis per 100 parts by weight of the metal oxide,
wherein $\beta$, which is a mole ratio of sum of Ba and Ca in relation to sum of Ti and Zr, is in a range of $1.0100 \leq \beta \leq 1.0200$.

41. A piezoelectric element, comprising:
a first electrode;
a piezoelectric material according to claim 40; and
a second electrode.

42. Electronic equipment, comprising the piezoelectric element according to claim 41.

* * * * *